United States Patent
Yu

(10) Patent No.: US 10,917,117 B2
(45) Date of Patent: Feb. 9, 2021

(54) ENCODING AND MODULATION METHOD AND COMMUNICATIONS APPARATUS

(71) Applicant: HUAWEI TECHNOLOGIES CO., LTD., Shenzhen (CN)

(72) Inventor: Rongdao Yu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/424,507

(22) Filed: May 29, 2019

(65) Prior Publication Data
US 2019/0280719 A1   Sep. 12, 2019

Related U.S. Application Data

(63) Continuation of application No. PCT/CN2017/106115, filed on Oct. 13, 2017.

(30) Foreign Application Priority Data

Nov. 30, 2016   (CN) .......................... 2016 1 1089101

(51) Int. Cl.
H03M 13/00   (2006.01)
H03M 13/25   (2006.01)
(Continued)

(52) U.S. Cl.
CPC ..... *H03M 13/255* (2013.01); *H03M 13/1148* (2013.01); *H04L 1/007* (2013.01);
(Continued)

(58) Field of Classification Search
CPC ............. H03M 13/255; H03M 13/1148; H03M 13/116; H04L 1/0058; H04L 1/0041;
(Continued)

(56) References Cited

U.S. PATENT DOCUMENTS

2008/0279303 A1* 11/2008 Wengerter .............. H04L 27/34
375/295
2011/0307754 A1* 12/2011 Sun .................... H03M 13/1148
714/752
(Continued)

FOREIGN PATENT DOCUMENTS

CN   101005333 A   7/2007
CN   101043483 A   9/2007
(Continued)

OTHER PUBLICATIONS

Du Junyi et al: "A progressive edge growth algorithm for bit mapping design of LDPC coded BICM schemes", 2016 IEEE International Symposium on Information Theory(ISIT), IEEE, Jul. 10, 2016, pp. 2129-2133, XP032940616.
(Continued)

*Primary Examiner* — Samir W Rizk
(74) *Attorney, Agent, or Firm* — Kilpatrick Townsend & Stockton LLP

(57) ABSTRACT

An LDPC code encoding and modulation method and a communications apparatus are provided to resolve a problem of poor transmission performance and low transmission reliability that are caused in an existing modulation method. Under the method, an information bit sequence $S_b$ can be obtained. The $S_b$ can be encoded by using a LDPC matrix H to generate an encoded code sequence $S_c$. The $S_c$ can be modulated to obtain a modulated symbol sequence $S_M$. This modulation may include mapping bits in a least reliable code block in the $S_c$ to non-least reliable bit locations for constellation modulation. $S_M$ can be sent to a receive end. In this way, reliability of all symbols in the $S_M$ is relatively high and uniform. A bit error rate can be effectively reduced, so that encoding performance is improved and more reliable transmission is implemented.

16 Claims, 9 Drawing Sheets

(51) Int. Cl.
  H03M 13/11 (2006.01)
  H04L 1/00 (2006.01)
  H04L 5/00 (2006.01)
  H04L 1/18 (2006.01)

(52) U.S. Cl.
  CPC .......... H04L 1/0041 (2013.01); H04L 1/0058 (2013.01); H04L 1/18 (2013.01); H04L 5/0055 (2013.01); *H03M 13/116* (2013.01); *H04L 1/0045* (2013.01); *H04L 1/0086* (2013.01)

(58) Field of Classification Search
  CPC .......... H04L 1/18; H04L 1/007; H04L 1/0045; H04L 1/0086
  See application file for complete search history.

(56) References Cited

U.S. PATENT DOCUMENTS

| | | |
|---|---|---|
| 2015/0089320 A1 | 3/2015 | Jeong et al. |
| 2015/0236816 A1 | 8/2015 | Myung et al. |

FOREIGN PATENT DOCUMENTS

| | | |
|---|---|---|
| WO | 2009028886 A2 | 3/2009 |
| WO | 2009060627 A1 | 5/2009 |
| WO | 2009069513 A1 | 6/2009 |

OTHER PUBLICATIONS

Yan Li et al., "Bit-Reliability Mapping in LDPC-Coded Modulation Systems", IEEE Communications Letters, vol. 9, No. 1, Jan. 2005, total 3 pages.

Yan, Keqian et al., Improved design of bit mapping based on EXIT-chart analysis for DVB-T2 system, IEEE Transactions on Consumer Electronics, Nov. 2011, vol. 57, No. 4, pp. 1579-1585, total 7 pages.

* cited by examiner

US 10,917,117 B2

ENCODING AND MODULATION METHOD AND COMMUNICATIONS APPARATUS

CROSS-REFERENCE TO RELATED APPLICATIONS

This application is a continuation of International Application No. PCT/CN2017/106115, filed on Oct. 13, 2017, which claims priority to Chinese Patent Application No. 201611089101.6, filed on Nov. 30, 2016. The disclosures of all of the aforementioned patent applications are hereby incorporated by reference in their entireties.

TECHNICAL FIELD

This application relates to the field of wireless communications technologies, and in particular, to an encoding and modulation method and a communications apparatus.

BACKGROUND

A communications system ensures communication reliability of noisy communications channels through encoding. These communications channels show a fixed capacity that is indicated as a quantity of bits of each code element at a particular signal-to-noise ratio (SNR), to define a theoretical upper limit (Shannon capacity). Therefore, an encoding solution is intended to obtain a rate close to the Shannon capacity. A type of code close to the Shannon capacity is a low-density parity-check (LDPC) code.

In the prior art, bits of an LDPC-encoded code words are sequentially mapped to a constellation point in a constellation diagram in a bit order. The inventor finds that quality of a signal obtained after such encoding and modulation is sometimes relatively poor, and transmission reliability is not very high.

SUMMARY

This application describes an encoding and modulation method, an apparatus, and a system.

According to a first aspect of embodiments of this application, an encoding and modulation method is provided. The encoding and modulation method includes: obtaining an information bit sequence $S_b$, and encoding the information bit sequence $S_b$ by using a low-density parity-check LDPC matrix H, to obtain an LDPC-encoded code sequence $S_c$; mapping, in a modulation process, bits in a least reliable code block in the code sequence $S_c$ to non-least reliable bit locations that are used for constellation modulation, so that the bits in the least reliable code block can be prevented from being mapped to least reliable bit locations that are used for constellation modulation, and reliability of all bits of modulated LDPC codes is relatively uniform, thereby improving encoding performance; and sending the modulated symbol sequence $S_M$ to a receive end, so that transmission reliability can be improved to a great extent.

In a possible design, the bits in the least reliable code block in the code sequence $S_c$ are mapped, in the modulation process, to most reliable or second-most reliable bit locations that are used for constellation modulation. In this way, it may be adequately ensured that reliability of the bits in the least reliable code block is remarkably improved after the bits in the least reliable code block are modulated by using most reliable or second-most reliable bit locations that are used for constellation modulation, thereby further reducing a bit error rate.

In a possible design, bits in a most reliable code block in the code sequence $S_c$ are mapped to least reliable bit locations that are used for constellation modulation. In this way, it may be ensured that the least reliable bit locations that are used for constellation modulation are not used to modulate the bits in the least reliable code block, so that modulation performance can also be effectively improved and a bit error rate can be reduced.

With reference to the first aspect and the foregoing possible implementations, the encoding and modulation method provided in this embodiment is applied to a hybrid automatic repeat request (HARQ), and includes:

when the symbol sequence $S_M$ needs to be retransmitted, modulating bits in a code block needing to be retransmitted, to obtain a modulated symbol sequence $S_R$ to be retransmitted, and then sending, to the receive end, the modulated symbol sequence $S_R$ to be retransmitted.

In a possible design, when the symbol sequence $S_M$ needs to be retransmitted, bits in a code block needing to be retransmitted in the code sequence $S_c$ are modulated in a modulation scheme described in the first aspect, to obtain a modulated symbol sequence $S_R$ to be retransmitted.

In another possible design, when the symbol sequence $S_M$ needs to be retransmitted, bits in a code block needing to be retransmitted in the code sequence $S_c$ are sequentially input into bit locations that are used for constellation modulation, to perform modulation to obtain a modulated symbol sequence $S_R$ to be retransmitted.

Optionally, before the bits in the code block needing to be retransmitted in the code sequence $S_c$ are modulated, inversion processing may be further performed on the bits in the code block needing to be retransmitted.

According to the technical solutions provided in this application and with reference to a HARQ transmission process, bits having different reliability are transmitted a plurality of times, to obtain a combination gain, thereby improving transmission reliability.

In a possible design, the constellation modulation in this application is 16QAM, 64QAM, 128QAM, or 256QAM constellation modulation.

According to a second aspect of the embodiments of this application, a communications apparatus is provided, including:

a processor, configured to: obtain an information bit sequence $S_b$, and encode the information bit sequence $S_b$ by using a low-density parity-check LDPC matrix H, to obtain an encoded code sequence $S_c$; and modulate the code sequence $S_c$, to obtain a modulated symbol sequence $S_M$, where bits in a least reliable code block in the code sequence $S_c$ are mapped, in a modulation process, to non-least reliable bit locations that are used for constellation modulation; and a transmitter, configured to send the modulated symbol sequence $S_M$ to a receive end.

According to a third aspect of the embodiments of this application, a communications apparatus is provided, including:

an encoding unit, configured to obtain an information bit sequence $S_b$, and encode the information bit sequence $S_b$ by using a low-density parity-check LDPC matrix H, to obtain an encoded code sequence $S_c$, where the LDPC matrix H is generated by expanding a base matrix z by using an expansion factor $H_b$, and a value of z is a positive integer;

a modulation unit, configured to modulate the code sequence $S_c$ that is obtained by the encoding unit through encoding, to obtain a modulated symbol sequence $S_M$, where bits in a least reliable code block in the code sequence $S_c$ are mapped, in a modulation process, to non-least reliable bit locations that are used for constellation modulation; and a sending unit, configured to send the modulated symbol sequence $S_M$ to a receive end.

With reference to the third aspect of the embodiments of this application, in a possible design, the communications apparatus further includes:

a re-modulation unit, configured to: when the symbol sequence $S_M$ needs to be retransmitted, modulate, in a mapping manner the same as a mapping manner used during initial transmission, bits in a code block needing to be retransmitted in the code sequence $S_c$, to obtain a modulated symbol sequence $S_R$ to be retransmitted.

The communications apparatus in the embodiments of this application may be a cellular terminal, a D2D terminal, a base station, a control node, or the like. For specific implementations of functions of the communications apparatus, refer to the encoding and modulation method provided in the possible implementations of the first aspect. Details are not described herein again.

According to the encoding and modulation method and the communications apparatuses that are provided in this application, the bits in the least reliable code block are mapped to the non-least reliable bit locations that are used for constellation modulation, so that the bits in the least reliable code block can be prevented from being mapped to the least reliable bit locations. For example, the bits in the least reliable code block are mapped to second-least reliable or more reliable bit locations. Alternatively, the bits in the most reliable code block are mapped to the least reliable bit locations, to prevent the bits in the least reliable code block from being mapped to the least reliable bit locations that are used for constellation modulation, so that reliability of all bits of modulated LDPC codes is relatively high and uniform, thereby improving encoding performance. In this way, a bit error rate can be effectively reduced, and more reliable transmission is implemented.

BRIEF DESCRIPTION OF DRAWINGS

To describe the embodiments of this application more clearly, the following briefly describes the accompanying drawings required for describing the embodiments. Apparently, the accompanying drawings in the following description show merely some embodiments of this application, and a person of ordinary skill in the art may still derive other drawings from these accompanying drawings without creative efforts.

DESCRIPTION OF EMBODIMENTS

Figure 1:
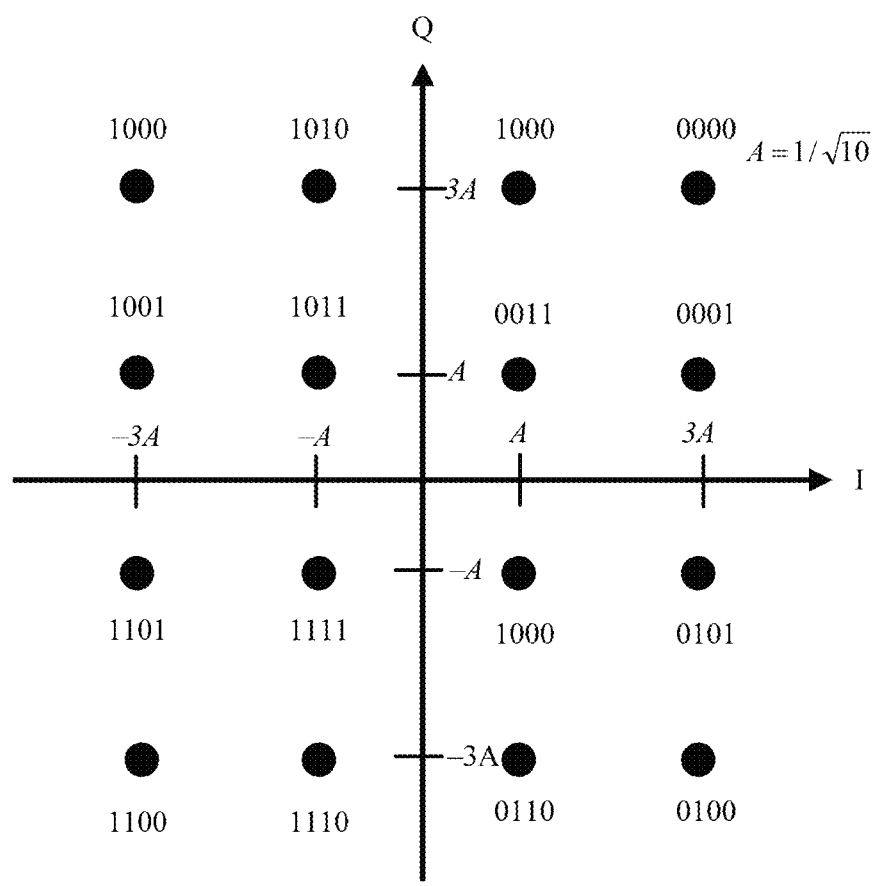
FIG. 1 is a 16QAM constellation modulation diagram.

The following describes the technical solutions in the embodiments of this application with reference to the accompanying drawings.

To perform LDPC encoding on a to-be-transmitted information bit sequence, an LDPC matrix first needs to be constructed for a wireless communications device. A typical LDPC matrix is as follows:

$$\begin{bmatrix} 1 & 1 & 1 & 1 & 0 & 0 & 0 & 0 & 0 & 0 & 0 & 0 & 0 & 0 & 0 & 0 & 0 & 0 & 0 & 0 \\ 0 & 0 & 0 & 0 & 1 & 1 & 1 & 1 & 0 & 0 & 0 & 0 & 0 & 0 & 0 & 0 & 0 & 0 & 0 & 0 \\ 0 & 0 & 0 & 0 & 0 & 0 & 0 & 0 & 1 & 1 & 1 & 1 & 0 & 0 & 0 & 0 & 0 & 0 & 0 & 0 \\ 0 & 0 & 0 & 0 & 0 & 0 & 0 & 0 & 0 & 0 & 0 & 0 & 1 & 1 & 1 & 1 & 0 & 0 & 0 & 0 \\ 0 & 0 & 0 & 0 & 0 & 0 & 0 & 0 & 0 & 0 & 0 & 0 & 0 & 0 & 0 & 0 & 1 & 1 & 1 & 1 \\ 1 & 0 & 0 & 0 & 1 & 0 & 0 & 0 & 1 & 0 & 0 & 0 & 1 & 0 & 0 & 0 & 0 & 0 & 0 & 0 \\ 0 & 1 & 0 & 0 & 0 & 1 & 0 & 0 & 0 & 1 & 0 & 0 & 0 & 0 & 0 & 1 & 0 & 0 & 0 & 0 \\ 0 & 0 & 1 & 0 & 0 & 0 & 1 & 0 & 0 & 0 & 0 & 0 & 1 & 0 & 0 & 0 & 1 & 0 & 0 & 0 \\ 0 & 0 & 0 & 1 & 0 & 0 & 0 & 0 & 0 & 1 & 0 & 0 & 0 & 1 & 1 & 0 & 0 & 0 & 1 & 0 \\ 0 & 0 & 0 & 0 & 0 & 0 & 1 & 0 & 0 & 0 & 1 & 0 & 0 & 0 & 0 & 0 & 0 & 0 & 0 & 1 \\ 1 & 0 & 0 & 0 & 0 & 1 & 0 & 0 & 0 & 0 & 1 & 0 & 0 & 0 & 0 & 0 & 1 & 0 & 0 & 0 \\ 0 & 1 & 0 & 0 & 0 & 0 & 1 & 0 & 0 & 1 & 0 & 0 & 0 & 0 & 1 & 0 & 0 & 0 & 0 & 0 \\ 0 & 0 & 1 & 0 & 0 & 0 & 0 & 1 & 0 & 0 & 0 & 0 & 1 & 0 & 0 & 0 & 0 & 0 & 1 & 0 \\ 0 & 0 & 0 & 1 & 0 & 0 & 0 & 0 & 1 & 0 & 0 & 0 & 1 & 0 & 0 & 1 & 0 & 0 & 0 & 0 \\ 0 & 0 & 0 & 0 & 1 & 0 & 0 & 0 & 0 & 1 & 0 & 0 & 0 & 0 & 1 & 0 & 0 & 0 & 0 & 1 \end{bmatrix}$$

In a wireless communications system, radio resource blocks (RB) of different sizes may be allocated to the wireless communications device according to different transmission requirements. However, when sizes of the RBs are different, LDPC code lengths that can be supported by the wireless communications device are also different.

Therefore, to enable the wireless communications device to be compatible with LDPC having different code lengths, an $m_b \times n_b$ base matrix $H_b$ may be generated in advance, where $m_b$ is a quantity of rows of the base matrix $H_b$, $n_b$ is a quantity of columns of the base matrix $H_b$, $m_b = n_b - k$, k is a length of an information bit sequence in LDPC, and values of $m_b$, $n_b$, and k are all positive integers. Then an expansion factor z corresponding to each LDPC code length is preset. After the LDPC code length is determined, the wireless communications device first obtains the expansion factor corresponding to the code length, and then expands the base matrix by using the expansion factor, to obtain a check matrix H corresponding to the code length. The check matrix H is an m×n matrix, where $m = z \times m_b$, $n = z \times n_b$, and values of z, m, and n are all positive integers. In this manner, different check matrices may be obtained based on the base matrix when LDPC code lengths are different, so that the wireless communications device can support the LDPC having different code lengths.

For example, the base matrix $H_b$ is $$\begin{bmatrix} 1 & 1 & 0 \\ -1 & 0 & 1 \end{bmatrix}.$$

In other words, $m_b=2$, $n_b=3$, and $H_b$ is a 2×3 base matrix. The base matrix $H_b$ is expanded by using an expansion factor $z=2$, the element "1" in $H_b$ is replaced with a matrix that is obtained by rotating a 2×2 unit matrix rightward by one bit, the element "0" is replaced with the 2×2 unit matrix, and the element "−1" is replaced with a 2×2 all-zero matrix. To be specific, an expanded LDPC matrix $H=m\times n=(z\times m_b)\times(z\times n_b)=(2\times 2)\times(2\times 3)=4\times 6$ is as follows:

$$\begin{bmatrix} 0 & 1 & 0 & 1 & 1 & 0 \\ 1 & 0 & 1 & 0 & 0 & 1 \\ 0 & 0 & 1 & 0 & 0 & 1 \\ 0 & 0 & 0 & 1 & 1 & 0 \end{bmatrix}$$

Figure 2:
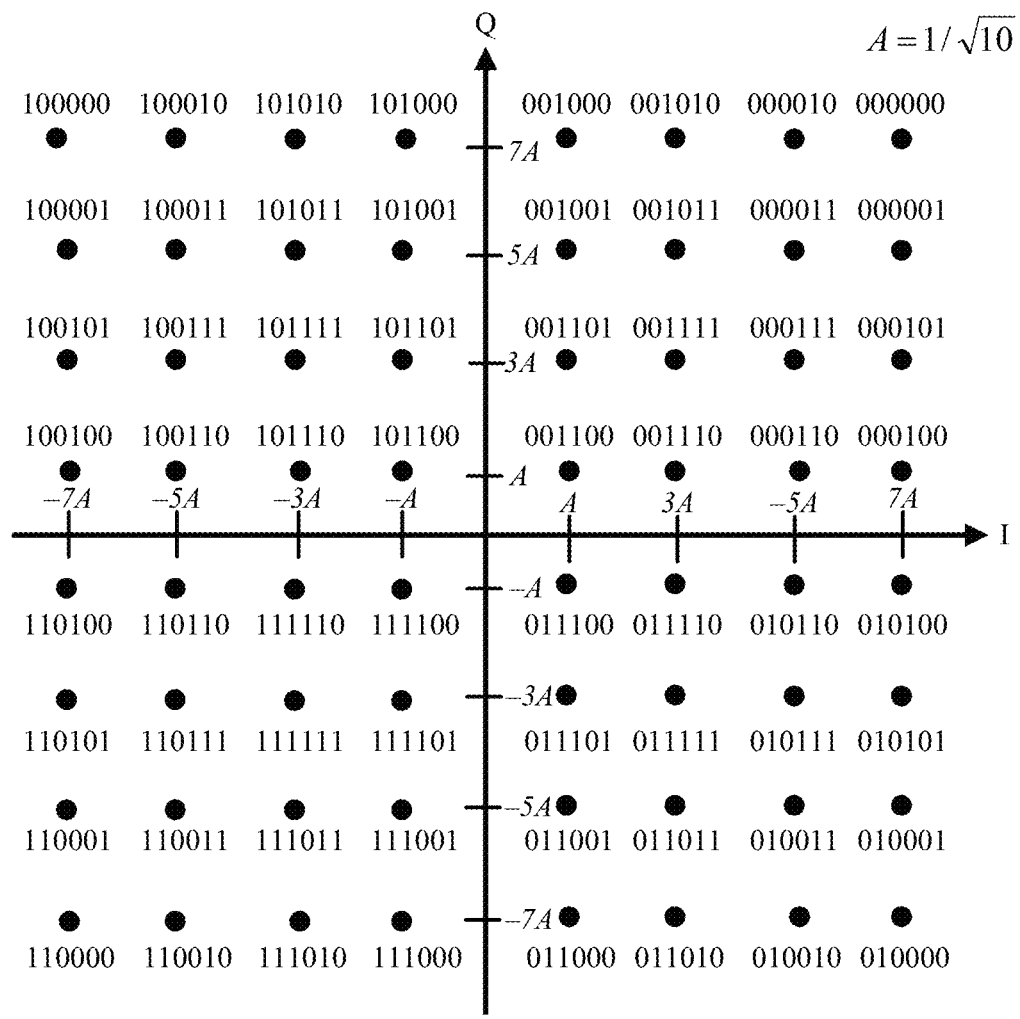
FIG. 2 is a 64QAM constellation modulation diagram.

After LDPC encoding is performed on the to-be-transmitted information bit sequence, an encoded information bit sequence is modulated through constellation modulation. Commonly used constellation modulation schemes are 16QAM, 64QAM, and the like. FIG. 1 shows a 16QAM (QAM: quadrature amplitude modulation) constellation diagram. There are a total of 16 black spots in FIG. 1, indicating 16 16QAM constellation points, and a four-bit code word may be mapped to each 16QAM constellation point. FIG. 2 shows a 64QAM (QAM: quadrature amplitude modulation) constellation diagram. There are a total of 64 black spots in FIG. 2, indicating 64 64QAM constellation points, and a six-bit code word may be mapped to each 64QAM constellation point.

Figure 3:
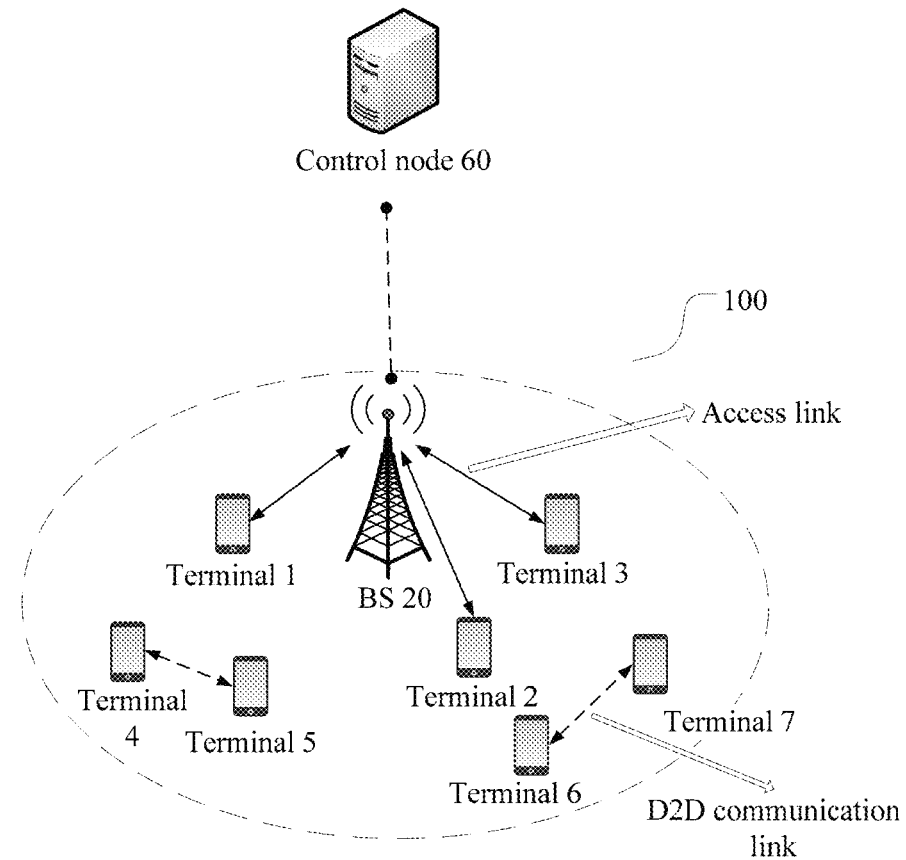
FIG. 3 is a schematic diagram of a communications system according to an embodiment of this application.

To resolve a prior-art technical problem that quality of a signal after the foregoing LDPC encoding and constellation modulation is so poor as to cause low transmission reliability, embodiments can provide a solution based on a communications system shown in FIG. 3, to reduce a bit error rate and improve transmission reliability.

As shown in FIG. 3, in accordance with one embodiment, a communications system 100 is provided. In this embodiment, the communications system 100 includes at least one base station (BS) and a plurality of terminals. When the base station or the terminal serves as a transmit end, the base station or the terminal performs a process of an encoding and modulation method in accordance with this embodiment, and may also be referred to as a communications apparatus.

The plurality of terminals in the communications system 100 may further include two terminals that may be used in device-to-device (D2D) communication, and optionally further include a terminal that may be used in cellular communication. The cellular communication is communication performed between the terminal and the base station. Certainly, the D2D terminal may also have a cellular communication function. The cellular terminal may also have a D2D communication function, and may also perform D2D communication with another D2D terminal when there is a requirement for communication between the cellular terminal and the another D2D terminal.

During the cellular communication, the base station transmits downlink data to the terminal, where LDPC encoding is performed on the data, and the LDPC-encoded data is modulated and then transmitted to the terminal; and the terminal transmits uplink data to the base station, where LDPC encoding may also be performed on the uplink data, and the LDPC-encoded data is modulated and then transmitted to the base station. During the D2D communication, when a D2D terminal at the transmit end sends data to a D2D terminal at a receive end, LDPC encoding may also be performed on the data, and the LDPC-encoded data is modulated and then transmitted to the D2D terminal at the receive end.

For example, in FIG. 3, cellular communication is performed between a terminal 1, a terminal 2, and a terminal 3 by using an access link, and LDPC encoding and modulation need to be performed on data to be transmitted between the base station and the terminal 1/the terminal 2/the terminal 3. D2D communication is performed between a terminal 4 and a terminal 5, and D2D communication is performed between a terminal 6 and a terminal 7. The terminal 4, the terminal 5, the terminal 6, and the terminal 7 may all have a cellular communication function. The terminal 1, the terminal 2, and the terminal 3 may also have a D2D communication function.

In this embodiment, a control node 60 connected to the base station may schedule resources in the system in a centralized manner, configure resources for the terminals, make a resource reuse decision, perform interference coordination, or the like.

In this embodiment of this application, the communications system 100 may be a system using various radio access technologies (radio access technology, RAT), for example, a Code Division Multiple Access (CDMA) system, a Time Division Multiple Access (TDMA) system, a Frequency Division Multiple Access (FDMA) system, an orthogonal Frequency Division Multiple Access (OFDMA) system, a single carrier Frequency Division Multiple Access (SC-FDMA) system, or another system. The term "system" and the term "network" may be interchanged with each other. The CDMA system may implement a wireless technology, such as Universal Terrestrial Radio Access (UTRA) or CDMA2000. UTRA may include a wideband CDMA (WCDMA) technology and another technology transformed from CDMA. CDMA2000 may cover the interim standard 2000 (IS-2000), the IS-95 standard, and the IS-856 standard. The TDMA system may implement a wireless technology, for example, Global System for Mobile Communications (GSM). The OFDMA system may implement a wireless technology, such as evolved Universal Terrestrial Radio Access (E-UTRA), Ultra Mobile Broadband (UMB), IEEE 802.11 (Wi-Fi), IEEE 802.16 (WiMAX), IEEE 802.20, or Flash OFDMA. UTRA and E-UTRA belong to UMTS and evolved versions of UMTS. A new version of UMTS, namely, E-UTRA, is used in 3GPP Long Term Evolution (LTE) and various versions evolved based on LTE. In addition, the communications system 100 is further applicable to a future-oriented communications technology. The technical solution provided in this embodiment of this application is applicable to any communications system using a new communications technology, as long as the communications system includes cellular communication. A system architecture and a service scenario that are described in this embodiment of this application are used to more clearly describe the technical solution in this embodiment of this application, and do not constitute a limitation on the technical solution provided in this embodiment of this application. A person of ordinary skill in the art may learn that as network architectures evolve and new service scenarios emerge, the technical solution provided in this embodiment of this application is also applicable to similar technical problems.

In this embodiment, the base station is an apparatus that is deployed on a radio access network, to provide a wireless communication function for the terminal. The base station may be in various forms, such as a macro base station, a micro base station (which is also referred to as a small cell), a relay station, or an access point. A device having a base station function may have different names in systems using different radio access technologies. For example, the device having the base station function is referred to as an evolved NodeB (eNB, or eNodeB) in an LTE system, a NodeB in a 3rd Generation (3G) system, or the like. For ease of description, in all embodiments of this application, apparatuses providing the wireless communication function for a terminal are collectively referred to as base stations or BSs.

In the communications system shown in FIG. 3, the control node may be connected to a plurality of base stations, and configure resources for a plurality of D2D terminals and a plurality of cellular terminals within coverage of the plurality of base stations. For example, the base station may be a NodeB in a UMTS system, and the control node may be a network controller. For another example, the base station may be a small cell, and the control node may be a macro base station covering the small cell. For still another example, the control node may be an inter-RAT radio network collaborative controller or the like, and the base station is a base station in a radio network. This is not limited in this embodiment of this application.

For ease of description, meanings of concepts and symbols referred to herein are provided below:

In various embodiments, $S_b$ may represent an information bit sequence, that is, a sequence that needs to be encoded by using an LDPC matrix, and the sequence includes a plurality of bits; and $S_c$ represents an LDPC-encoded bit sequence, that is, a sequence generated after the information bit sequence $S_b$ is encoded by using the LDPC matrix. $S_M$ represents a modulated symbol sequence, and $S_R$ is a re-modulated symbol sequence to be retransmitted.

To further describe the encoding and modulation method implemented in the communications system provided in this application, an LDPC base matrix $H_b$ and an LDPC matrix H in this embodiment of this application are further described.

For the base matrix $H_b$ in this embodiment, a base matrix whose bit rate is $$\frac{n_b - m_b}{n_b}$$

$n_b$ may be constructed based on a quantity $m_b$ of rows of the base matrix and a quantity $n_b$ of columns of the base matrix by using a density evolution theory or a progressive edge growth (progressive edge growth, PEG for short) method. A value of the quantity $m_b$ of rows and a value of the quantity of columns may be determined according to a data transmission requirement in wireless communication. A method for generating or constructing the base matrix $H_b$ is not described herein again.

The LDPC matrix H is constructed based on one base matrix $H_b$, and is obtained by performing expansion by using a circulant permutation matrix. The LDPC matrix H is represented as follows:

$$H = \begin{bmatrix} P_{0,0} & P_{0,1} & P_{0,2} & \cdots & P_{0,n_b-2} & P_{0,n_b-1} \\ P_{1,0} & P_{1,1} & P_{1,2} & \cdots & P_{1,n_b-2} & P_{1,n_b-1} \\ P_{2,0} & P_{2,1} & P_{2,2} & \cdots & P_{2,n_b-2} & P_{0,n_b-1} \\ \cdots & \cdots & \cdots & \cdots & \cdots & \cdots \\ P_{m_b-1,0} & P_{m_b-1,1} & P_{m_b-1,2} & \cdots & P_{m_b-1,n_b-2} & P_{m_b-1,n_b-1} \end{bmatrix} = P^{H_b},$$

where

P represents a permutation matrix.

When the base matrix $H_b$ is expanded, each element whose value is −1 in the base matrix $H_b$ is expanded to obtain an all-zero matrix whose size is z×z, and any other element whose value is not "−1" is expanded to obtain a permutation matrix whose size is z×z, where z is an actual expansion factor. The permutation matrix may be obtained by cyclically shifting a unit matrix for a corresponding quantity of shift times, and the quantity of shift times corresponds to the value of the element. Specifically, the value of the element may be transformed according to the following formula (1), to obtain the quantity of shift times.

$$p(f, i, j) = \begin{cases} p(i, j), & p(i, j) \le 0 \\ \left\lfloor \frac{p(i, j) z_f}{z_0} \right\rfloor, & p(i, j) > 0 \end{cases} \quad (1)$$

In the formula (1), $z_0$ is a maximum value of an expansion factor, $z_f$ is an actual expansion factor, p(i, j) is a value of an element in row i and in column j of the base matrix, $\lfloor \ \rfloor$ represents rounding down, and p(f,i,j) represents the quantity of shift times.

The technical solutions provided in this application are described below by using the following base matrix $H_b$ as an example.

$$H_b = \begin{bmatrix} 1 & 0 & -1 & 2 & 0 & -1 \\ -1 & 2 & 0 & 1 & -1 & 0 \\ 0 & 1 & -1 & 0 & -1 & 0 \end{bmatrix}$$

The quantity of rows $m_b$ of the base matrix $H_b$ is equal to 3, and the quantity $n_b$ of columns is equal to 6. In other words, the base matrix $H_b$ is a 3×6 matrix.

When the base matrix $H_b$ is expanded, the element "0" in the base matrix $H_b$ is permutated by using a unit matrix, the element "−1" is permutated by using an all-zero matrix, and cyclic permutation is performed, based on the unit matrix, on an element that is not "0" or "−1". For example, a $2^{nd}$ element in row 2 is 2, and it is assumed that the actual expansion factor z is equal to 3. In this case, a corresponding permutation matrix may be obtained by cyclically shifting the unit matrix rightward or leftward twice.

The unit matrix for permutating the element "0" is as follows:

$$\begin{bmatrix} 1 & 0 & 0 \\ 0 & 1 & 0 \\ 0 & 0 & 1 \end{bmatrix}$$

The all-zero matrix for permutating the element "−1" is as follows:

$$\begin{bmatrix} 0 & 0 & 0 \\ 0 & 0 & 0 \\ 0 & 0 & 0 \end{bmatrix}$$

A matrix for permutating an element "1" is obtained by cyclically shifting the unit matrix leftward or rightward by one bit, and cyclically shifting rightward is used as an example herein:

$$\begin{bmatrix} 0 & 1 & 0 \\ 0 & 0 & 1 \\ 1 & 0 & 0 \end{bmatrix}$$

A matrix for permutating an element "2" is obtained by cyclically shifting the unit matrix leftward or rightward by two bits, and cyclically shifting rightward is used as an example herein:

$$\begin{bmatrix} 0 & 0 & 1 \\ 1 & 0 & 0 \\ 0 & 1 & 0 \end{bmatrix}$$

The expanded LDPC matrix is an m×n matrix, where $m = z \times m_b = 3 \times 3 = 9$ and $n = z \times n_b = 3 \times 6 = 18$. To be specific, the expanded LDPC matrix is a 9×18 matrix as follows:

$$H = \begin{bmatrix} 0 & 1 & 0 & 1 & 0 & 0 & 0 & 0 & 0 & 0 & 0 & 1 & 1 & 0 & 0 & 0 & 0 & 0 \\ 0 & 0 & 1 & 0 & 1 & 0 & 0 & 0 & 0 & 1 & 0 & 0 & 0 & 1 & 0 & 0 & 0 & 0 \\ 1 & 0 & 0 & 0 & 0 & 1 & 0 & 0 & 0 & 0 & 1 & 0 & 0 & 0 & 1 & 0 & 0 & 0 \\ 0 & 0 & 0 & 0 & 0 & 1 & 1 & 0 & 0 & 0 & 1 & 0 & 0 & 0 & 0 & 1 & 0 & 0 \\ 0 & 0 & 0 & 1 & 0 & 0 & 0 & 1 & 0 & 0 & 0 & 1 & 0 & 0 & 0 & 0 & 1 & 0 \\ 0 & 0 & 0 & 0 & 1 & 0 & 0 & 0 & 1 & 1 & 0 & 0 & 0 & 0 & 0 & 0 & 0 & 1 \\ 1 & 0 & 0 & 0 & 1 & 0 & 0 & 0 & 0 & 1 & 0 & 0 & 0 & 0 & 0 & 1 & 0 & 0 \\ 0 & 1 & 0 & 0 & 0 & 1 & 0 & 0 & 0 & 0 & 1 & 0 & 0 & 0 & 0 & 0 & 1 & 0 \\ 0 & 0 & 1 & 1 & 0 & 0 & 0 & 0 & 0 & 0 & 0 & 1 & 0 & 0 & 0 & 0 & 0 & 1 \end{bmatrix}$$

In other words, the check matrix H is a matrix including a plurality of 3×3 permutation matrices, a code length of LDPC is 18, and a quantity of check bits of LDPC encoding is 9.

To further describe the encoding and modulation method and the communications apparatuses that are provided in the embodiments of this application, technical terms, namely, a column weight and a code degree in the embodiments of this application are described below first.

Column weight: For the base matrix $H_b$, a column weight is a quantity of elements that are not "−1" in each column. For example, column weights of the base matrix $H_b$ are calculated in Table 1 below.

TABLE 1

Column weights of the base matrix $H_b$

| Column Number | Column 1 | Column 2 | Column 3 | Column 4 | Column 5 | Column 6 |
|---|---|---|---|---|---|---|
| Column weight | 2 | 3 | 1 | 3 | 1 | 2 |

$$H_b = \begin{bmatrix} 1 & 0 & -1 & 2 & 0 & -1 \\ -1 & 2 & 0 & 1 & -1 & 0 \\ 0 & 1 & -1 & 0 & -1 & 0 \end{bmatrix}$$

For the check matrix H, a column weight is a quantity of elements "1" in each column. For example, column weights of the check matrix H are calculated in Table 2 below.

TABLE 2

Column weights of the check matrix H

| Column number | Column 1 | Column 2 | Column 3 | Column 4 | Column 5 | Column 6 | Column 7 | Column 8 | Column 9 | Column 10 |
|---|---|---|---|---|---|---|---|---|---|---|
| Column weight | 2 | 2 | 2 | 3 | 3 | 3 | 1 | 1 | 1 | 3 |

| Column number | Column 11 | Column 12 | Column 13 | Column 14 | Column 15 | Column 16 | Column 17 | Column 18 |
|---|---|---|---|---|---|---|---|---|
| Column weight | 3 | 3 | 1 | 1 | 1 | 2 | 2 | 2 |

$$H = \begin{bmatrix} 0 & 1 & 0 & 1 & 0 & 0 & 0 & 0 & 0 & 0 & 1 & 1 & 0 & 0 & 0 & 0 & 0 \\ 0 & 0 & 1 & 0 & 1 & 0 & 0 & 0 & 1 & 0 & 0 & 0 & 1 & 0 & 0 & 0 & 0 \\ 1 & 0 & 0 & 0 & 0 & 1 & 0 & 0 & 0 & 1 & 0 & 0 & 0 & 1 & 0 & 0 & 0 \\ 0 & 0 & 0 & 0 & 1 & 1 & 0 & 0 & 0 & 1 & 0 & 0 & 0 & 0 & 1 & 0 & 0 \\ 0 & 0 & 1 & 0 & 0 & 0 & 1 & 0 & 0 & 0 & 1 & 0 & 0 & 0 & 0 & 1 & 0 \\ 0 & 0 & 0 & 1 & 0 & 0 & 0 & 1 & 1 & 0 & 0 & 0 & 0 & 0 & 0 & 0 & 1 \\ 1 & 0 & 0 & 1 & 0 & 0 & 0 & 0 & 1 & 0 & 0 & 0 & 0 & 0 & 1 & 0 & 0 \\ 0 & 0 & 0 & 1 & 0 & 0 & 0 & 0 & 1 & 0 & 0 & 0 & 0 & 0 & 0 & 1 & 0 \\ 0 & 0 & 1 & 1 & 0 & 0 & 0 & 0 & 0 & 0 & 1 & 0 & 0 & 0 & 0 & 0 & 1 \end{bmatrix}$$

It should be noted that after the LDPC matrix H is generated by expanding the base matrix $H_b$ by using the expansion factor z, according to a principle that column weight values of z expanded columns are equal to a column weight value of an original column corresponding to the z expanded columns, column weight values of corresponding columns of the check matrix H can be obtained by calculating a column weight value of each column of the base matrix $H_b$. For example, a column weight value of column 1 of the base matrix $H_b$ is 2. After the base matrix $H_b$ is expanded by using an expansion factor z=3, column 1 is expanded to column 1, column 2, and column 3 in the check matrix H and column weight values of column 1, column 2, and column 3 are equal to the column weight value 2 of column 1 of the base matrix $H_b$.

Code degree: The code degree in the embodiments of this application is obtained as follows: encoding the to-be-transmitted information bit sequence $S_b$ by using the LDPC matrix H, to obtain the code sequence $S_c$ where bits in the code sequence $S_c$ are grouped into a plurality of code blocks, for example, the bits in the code sequence $S_c$ are grouped into a plurality of code blocks by using the expansion factor z; and calculating a degree of each code block, to obtain a code degree of each code block.

In various embodiments, manners of calculating the code degree may be flexible and variable, and may include at least one of the following two manners.

Manner 1: Calculate a column weight of each column of the base matrix $H_b$, and calculate, based on the column weight of each column, a degree of a code block corresponding to each column.

Manner 2: Calculate a column weight of each column of the check matrix H, and calculate, based on the column weight of each column, a degree of a code block corresponding to each column.

The code sequence $S_c$ that is obtained through encoding by using the 9×18 check matrix H and that has a code length of 18 bits is used as an example. The code sequence $S_c$ is divided into six blocks with z=3 bits per block, that is, a code block 1, a code block 2, a code block 3, a code block 4, a code block 5, and a code block 6. Columns that are of the LDPC matrix H and that correspond to each code block are three 3×3 block matrices. A combination of Table 3 and the matrices is shown below.

There are a plurality of possible forms for the foregoing two manners of calculating the code degree during specific implementation:

In one manner of calculating the code degree of each code block of the code sequence $S_c$, a code degree of a corresponding code block can be obtained by calculating the column weight of each column of the base matrix $H_b$, that is, by calculating a quantity of elements that are not "−1" in each column of the base matrix $H_b$. For example, after it is obtained through calculation that the column weight value of column 1 of the base matrix $H_b$ is 2, a code degree of the code block 1 can be obtained as 2.

In another manner of calculating the code degree of each code block of the code sequence $S_c$, a code degree of a corresponding code block can be obtained by calculating the column weight of each column of the base matrix $H_b$ and then multiplying the column weight by the expansion factor. For example, after it is obtained through calculation that the column weight value of column 1 of the base matrix $H_b$ is 2, the column weight value 2 is multiplied by an expansion factor 3, and then a code degree of the code block 1 can be obtained as 6.

In still another manner of calculating the code degree of each code block of the code sequence $S_c$, a code degree of a code block can be obtained after a column weight value of each column of the check matrix H is obtained by calculating a quantity of elements "1" in each column of the check matrix H. For example, after it is obtained through calculation that column weight values of columns 1 to 3 of the check matrix H are 2, a code degree of the code block 1 can be obtained as 2.

In yet another manner of calculating the code degree of each code block of the code sequence $S_c$, a code degree of a code block can be obtained by adding up column weights of columns, in the check matrix H, that correspond to each code block or by multiplying a column weight of a single column by the expansion factor. For example, if it is obtained through calculation that column weight values of columns 1 to 3 of the check matrix H are all 2, a code degree of the code block 1 may alternatively be: 2+2+2=6, or 2×3=6; and so on.

TABLE 3

| Code degrees of code blocks | | | | | | |
|---|---|---|---|---|---|---|
| | Code block | | | | | |
| | Code block 1 | Code block 2 | Code block 3 | Code block 4 | Code block 5 | Code block 6 |
| Code degree | 2 | 3 | 1 | 3 | 1 | 2 |

$$H = \begin{bmatrix} 0 & 1 & 0 & 1 & 0 & 0 & 0 & 0 & 0 & 0 & 0 & 1 & 1 & 0 & 0 & 0 & 0 & 0 \\ 0 & 0 & 1 & 0 & 1 & 0 & 0 & 0 & 0 & 1 & 0 & 0 & 0 & 1 & 0 & 0 & 0 & 0 \\ 1 & 0 & 0 & 0 & 0 & 1 & 0 & 0 & 0 & 1 & 0 & 0 & 0 & 1 & 0 & 0 & 0 \\ 0 & 0 & 0 & 0 & 0 & 1 & 1 & 0 & 0 & 0 & 1 & 0 & 0 & 0 & 0 & 1 & 0 & 0 \\ 0 & 0 & 0 & 1 & 0 & 0 & 0 & 1 & 0 & 0 & 0 & 1 & 0 & 0 & 0 & 0 & 1 & 0 \\ 0 & 0 & 0 & 0 & 1 & 0 & 0 & 0 & 1 & 1 & 0 & 0 & 0 & 0 & 0 & 0 & 0 & 1 \\ 1 & 0 & 0 & 0 & 1 & 0 & 0 & 0 & 0 & 1 & 0 & 0 & 0 & 0 & 1 & 0 & 0 & 0 \\ 0 & 1 & 0 & 0 & 0 & 1 & 0 & 0 & 0 & 0 & 1 & 0 & 0 & 0 & 0 & 0 & 1 & 0 \\ 0 & 0 & 1 & 1 & 0 & 0 & 0 & 0 & 0 & 0 & 0 & 1 & 0 & 0 & 0 & 0 & 0 & 1 \end{bmatrix}$$

As shown Table 3, the LDPC-encoded code sequence $S_c$ is divided into six code blocks, and the code degree of each code block is as follows: A code degree of the code block 1 is 2, a code degree of the code block 2 is 3, a code degree of the code block 3 is 1, a code degree of the code block 4 is 3, a code degree of the code block 5 is 1, and a code degree of the code block 6 is 2.

It may be learned, by comparing Table 1 with Table 2, that a code degree value of each code block is the same as the column weight value of each column of the base matrix b, and is equal to column weight values of corresponding columns of the expanded check matrix H.

To further describe the encoding and modulation method implemented in the communications system provided in this application, an association relationship between reliability of each code block in the LDPC-encoded code sequence and a column weight/a code degree of each block in this embodiment of this application is first described.

After LDPC encoding is performed on the to-be-transmitted information bit sequence $S_b$ by using the LDPC matrix, the code sequence $S_c$ is obtained, where the code sequence $S_c$ includes a plurality of bits, and reliability of each bit varies. In this embodiment of this application, reliability of an encoded bit is associated with a code degree of a code block to which the encoded bit belongs, and a code degree of a code block is in direct proportion to a column weight value of the base matrix $H_b$ or the check matrix H.

A higher column weight value of a column of the base matrix $H_b$ indicates higher reliability of a code block, in the code sequence $S_c$, corresponding to the column, higher reliability of bits belonging to the code block, and a lower bit error rate of transmission to be performed after the code block is modulated. On the contrary, a lower column weight value of a column of the base matrix $H_b$ indicates lower reliability of a code block, in the code sequence $S_c$, corresponding to the column, lower reliability of bits belonging to the code block, and a lower bit error rate of transmission to be performed after the code block is modulated.

Specifically, as shown in Table 4, it is assumed that the LDPC-encoded code sequence $S_c$ includes 18 bits: $S_1$, $S_2$, $S_3$, $S_4$, $S_5$, . . . , $S_{18}$, and is divided into six code blocks by using the expansion factor z.

According to calculation in a calculation manner provided in the foregoing embodiment, the code degree of each code block is as follows: A code degree of a code block 1 is 2, a code degree of a code block 2 is 3, a code degree of a code block 3 is 1, a code degree of a code block 4 is 3, a code degree of a code block 5 is 1, and a code degree of a code block 6 is 2.

Herein, a column weight of a column of the base matrix $H_b$ or the check matrix H is used as a code degree of a corresponding code block. In another implementation, alternatively, a column weight of a column of the base matrix $H_b$ may be multiplied by the expansion factor z and a product is used as the code degree of the code block, or column weights of z columns corresponding to the code block are added up as the code degree of the code block.

The code degree of the code block 2 and the code degree of the code block 4 are relatively high, and therefore the code block 2 and the code block 4 may be considered as most reliable code blocks. The code block 2 and the code block 4 correspond to bits $S_4$, $S_5$, $S_6$, and bits $S_{10}$, $S_{11}$, $S_{12}$ in the code sequence $S_c$, and the six bits may be considered to be the most reliable. Likewise, reliability of each bit in the code sequence $S_c$ may be determined.

TABLE 4

Correspondence between code degrees and column weights of a base matrix and a check matrix

| Code sequence $S_c$ | $S_1$ | $S_2$ | $S_3$ | $S_4$ | $S_5$ | $S_6$ | $S_7$ | $S_8$ | $S_9$ |
|---|---|---|---|---|---|---|---|---|---|
| Code block | | Code block 1 | | | Code block 2 | | | Code block 3 | |
| Column corresponding to the base matrix | | Column 1 | | | Column 2 | | | Column 3 | |
| Column weight of the base matrix | | 2 | | | 3 | | | 1 | |
| Column corresponding to the check matrix | Column 1 | Column 2 | Column 3 | Column 4 | Column 5 | Column 6 | Column 7 | Column 8 | Column 9 |
| Column weight of the check matrix | 2 | 2 | 2 | 3 | 3 | 3 | 1 | 1 | 1 |

| | Code sequence $S_c$ | $S_{10}$ | $S_{11}$ | $S_{12}$ | $S_{13}$ | $S_{14}$ | $S_{15}$ | $S_{16}$ | $S_{17}$ | $S_{18}$ |
|---|---|---|---|---|---|---|---|---|---|---|
| | Code block | | Code block 4 | | | Code block 5 | | | Code block 6 | |
| | Column corresponding to the base matrix | | Column 4 | | | Column 5 | | | Column 6 | |
| | Column weight of the base matrix | | 3 | | | 1 | | | 2 | |
| | Column corresponding to the check matrix | Column 10 | Column 11 | Column 12 | Column 13 | Column 14 | Column 15 | Column 16 | Column 17 | Column 18 |
| | Column weight of the check matrix | 3 | 3 | 3 | 1 | 1 | 1 | 2 | 2 | 2 |

The following describes, with reference to FIG. 1 to FIG. 12 and Table 1 to Table 4, an implementation process in which the encoding and modulation method provided in the embodiments of this application is applied to the cellular terminal, the D2D terminal, and the control node in the communications system 100.

Figure 4:
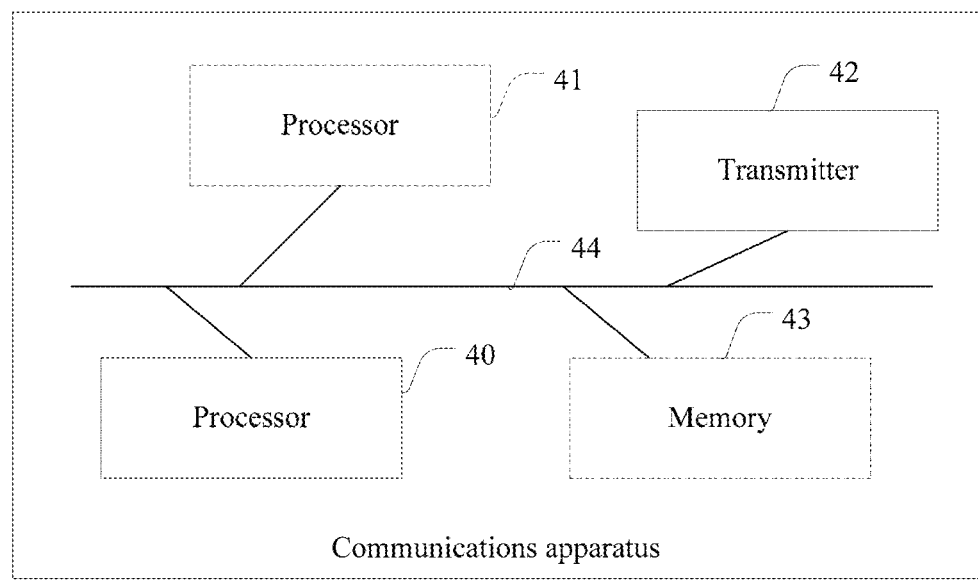
FIG. 4 is a schematic structural diagram of a communications apparatus according to an embodiment of this application.

FIG. 4 is a structural diagram of a communications apparatus according to an embodiment. The communications apparatus includes a processor 40 and a transmitter 42.

The processor 40 is configured to: obtain an information bit sequence $S_b$, and encode the information bit sequence $S_b$ by using a low-density parity-check LDPC matrix H, to obtain an encoded code sequence $S_c$; and modulate the code sequence $S_c$, to obtain a modulated symbol sequence $S_M$, where bits in a least reliable code block in the code sequence $S_c$ are mapped, in a modulation process, to non-least reliable bit locations that are used for constellation modulation. This avoids a problem of a poor modulation effect and a very high bit error rate that are caused by mapping the bits in the least reliable code block to least reliable bit locations that are used for constellation modulation, so that reliability of the modulated symbol sequence is relatively high.

In some embodiments, a plurality of processors configured to process different data or signaling may be disposed. For example, a processor 41 may be further disposed. Alternatively, a plurality of processors are configured to separately process encoding and modulation. For example, the processor 40 is used as an LDPC encoder, and the processor 41 is used as a constellation modulator. For details, refer to FIG. 5.

The transmitter 42 is configured to send the modulated symbol sequence $S_M$ to a receive end. In another implementation, the transmitter 42 may alternatively be a transmitter, a communications interface, or the like.

The communications apparatus further includes a memory 43 storing a computer-executable instruction, and a system bus 44. The system bus is connected to the processor 40, the processor 41, the memory 43, and the like.

Figure 5:
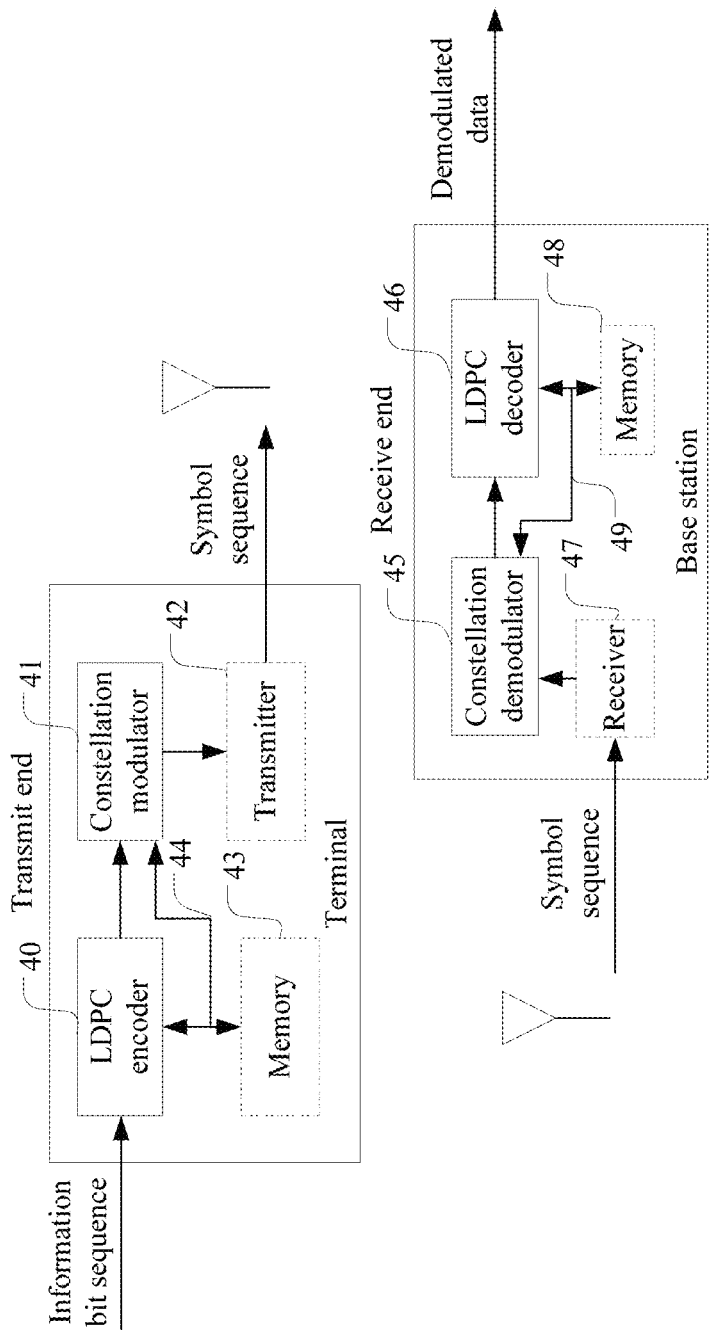
FIG. 5 is a schematic diagram of an implementation scenario of an encoding and modulation method according to an embodiment of this application.
Figure 6:
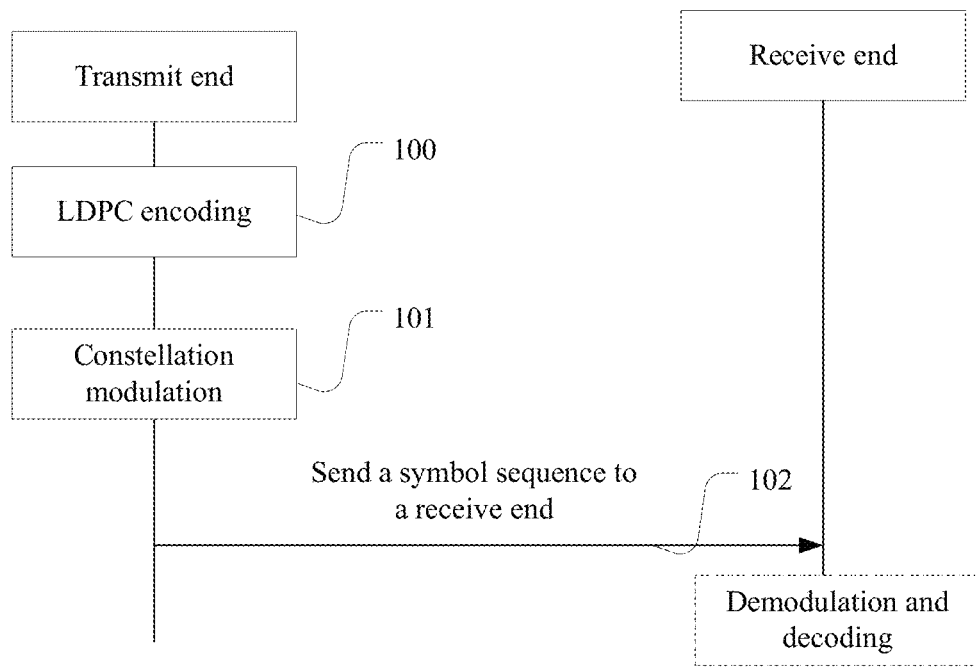
FIG. 6 is a schematic flowchart of Embodiment 1 of an encoding and modulation method according to an embodiment of this application.

FIG. 5 shows a scenario in accordance with one embodiment. In this embodiment, communications apparatuses are a terminal and a base station. The terminal serves as a transmit end, and transmits data or signaling to the base station that serves as a receive end. The data and signaling are embodied as an information bit sequence $S_b$. A process of implementing encoding and modulation in the scenario is described with reference to FIG. 6.

Step 100: Obtain an information bit sequence $S_b$, and an LDPC encoder 40 of the terminal encodes the information bit sequence $S_b$ by using a low-density parity-check LDPC matrix H, to obtain an encoded code sequence $S_c$.

Step 101: A constellation modulator 41 modulates the code sequence $S_c$, to obtain a modulated symbol sequence $S_M$, where bits in a least reliable code block are mapped to non-least reliable bit locations that are used for constellation modulation. This avoids a problem of a poor modulation effect and a very high bit error rate that are caused by mapping the bits in the least reliable code block to least reliable bit locations that are used for constellation modulation, so that reliability of the modulated symbol sequence is relatively high.

Step 102: A transmitter 42 of the terminal performs uplink transmission to transmit the modulated symbol sequence to the base station.

After receiving the modulated symbol sequence, a receiver 47 of the base station may first perform constellation demodulation on the modulated symbol sequence by using a constellation demodulator 45, and then an LDPC decoder 46 performs LDPC decoding. A bit error rate of a modulation result is low on a terminal side. Therefore, when demodulation is performed on a base station side, decoding can be correctly performed, thereby improving transmission performance.

The terminal may further include a memory 43. The memory 43 stores a computer instruction, and is connected to the LDPC encoder 40 and the constellation modulator 41 by using a system bus 44. The LDPC encoder 40 and the constellation modulator 41 run the instruction stored in the memory 43, to complete encoding and modulation. The base station may further include a memory 48. The memory 48 stores a computer instruction, and is connected to the constellation demodulator 45 and the LDPC decoder 46 by using a system bus 49. The constellation demodulator 45 and the LDPC decoder 46 execute the instruction in the memory 48, to complete demodulation and decoding.

It should be noted that FIG. 5 shows a case in which the terminal serves as a transmit end and the base station serves as a receive end. The application scenario in this embodiment is not limited thereto, and is also applicable when the base station serves as a transmit end, the terminal serves as a receive end, and the base station sends downlink data or signaling to the terminal; or applicable when a transmit end of a D2D terminal sends D2D data or signaling to a receive end of the D2D terminal; or applicable when a base station transmits data or signaling to another base station; or applicable when a control node transmits data or signaling to a base station; or the like. The LDPC encoding and modulation technical solution in this application may be applied as long as data or signaling transmission is performed between pairwise communications devices.

According to the encoding and modulation method and the communications apparatuses that are provided in this disclosure, bits in a code block that have different reliability during LDPC encoding may be modulated together with bits having different reliability during constellation modulation, and the bits in the least reliable code block are mapped to the non-least reliable bit locations, to avoid very poor reliability of modulated bits of an LDPC code, so that encoding performance is improved, a bit error rate can be effectively reduced, and more reliable transmission is implemented.

In one implementation, the bits in the least reliable code block may be mapped to second-least reliable or more reliable bit locations. In this way, it may be adequately ensured that reliability of the bits in the least reliable code block is improved after the bits in the least reliable code block are modulated by using most reliable or second-most reliable bit locations that are used for constellation modulation, thereby further reducing a bit error rate.

Alternatively, in another implementation, bits in a most reliable code block are mapped to the least reliable bit locations, to prevent the bits in the least reliable code block from being mapped to the least reliable bit locations that are used for constellation modulation. In this way, it may be ensured that the least reliable bit locations that are used for constellation modulation are not used to modulate the bits in the least reliable code block, thereby effectively improving modulation performance and reducing a bit error rate.

The constellation modulation in this embodiment is 16QAM constellation modulation, 64QAM constellation modulation, 128QAM constellation modulation, or 256QAM constellation modulation. A form of representation of the constellation modulation may be a constellation diagram, where a plurality of constellation points are distributed in the constellation diagram, each constellation point includes a plurality of bits, and each constellation point corresponds to one symbol. In another implementation, the constellation modulation may be further a constellation mapping table, that is, bits and a symbol that correspond to each constellation point in the constellation diagram are drawn in one table for representation. A method for obtaining the constellation mapping table or the constellation diagram or a manner of constructing the constellation mapping table or the constellation diagram is not described herein again.

There may be a plurality of forms of representation of the constellation modulation, and actual modulation processes of the constellation modulation are the same. In this embodiment, a constellation diagram form is used for description. Modulation processes in other forms may be obtained according to a mapping principle.

A typical 16QAM constellation diagram is shown in FIG. 1, and a typical 64QAM constellation diagram is shown in FIG. 2. In this embodiment of this application, a modulation process is described in detail by using the two types of constellation modulation as an example. For other constellation modulation forms, modulation processes are similar.

In this embodiment of this application, the constellation modulation process is described by using three scenarios.

be considered to be the highest. In other words, reliability of $4^{th}$ to $6^{th}$ and $10^{th}$ to $12^{th}$ bits 101011 is the highest. A code degree of the code block 3 and a code degree of the code block 5 are the same as column weight values 1 of column 3 and column 5 in the base matrix $H_b$, and reliability of the code block 3 and reliability of the code block 5 may be considered to be the lowest. In other words, reliability of $7^{th}$ to $9^{th}$ and $13^{th}$ to $15^{th}$ bits 110101 is the lowest. A code degree of the code block 1 and a code degree of the code block 6 are the same as column weight values 2 of column 1 and column 6 in the base matrix $H_b$, and reliability of the code block 1 and reliability of the code block 6 may be considered to be intermediate. In other words, reliability of $1^{st}$ to $3^{rd}$ and $16^{th}$ to $18^{th}$ bits 110100 is intermediate.

TABLE 5

Correspondence between code degrees and column weights of the base matrix

| Sequence number of a bit | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| Code sequence $S_c$ | 1 | 1 | 0 | 1 | 0 | 1 | 1 | 1 | 0 | 0 | 1 | 1 | 1 | 0 | 1 | 1 | 0 | 0 |
| Code block | Code block 1 | | | Code block 2 | | | Code block 3 | | | Code block 4 | | | Code block 5 | | | Code block 6 | | |
| Code degree | 2 | | | 3 | | | 1 | | | 3 | | | 1 | | | 2 | | |
| Column corresponding to the base matrix | Column 1 | | | Column 2 | | | Column 3 | | | Column 4 | | | Column 5 | | | Column 6 | | |
| Column weight of the base matrix | 2 | | | 3 | | | 1 | | | 3 | | | 1 | | | 2 | | |

First scenario: a process in which a column weight of each column in a base matrix $H_b$ is calculated, a code degree of a code block that is in the code sequence $S_c$ and that corresponds to each column is determined, and constellation modulation is performed based on code degrees of code blocks in the code sequence $S_c$.

For example, the code sequence $S_c$ obtained after the information bit sequence $S_b$ is encoded by using the LDPC matrix H is 110 101 110 011 101 100, and is divided into a code block 1, a code block 2, a code block 3, a code block 4, a code block 5, and a code block 6. A rule of division of the code blocks is described previously. Details are not described herein again.

In this embodiment, the column weight of each column of the base matrix $H_b$ is calculated, and the code degree of the code block that is in the code sequence $S_c$ and that corresponds to each column is determined.

It may be learned, based on a correspondence in Table 5, that a code degree of the code block 2 and a code degree of the code block 4 are the same as column weight values 3 of column 2 and column 3 of the base matrix $H_b$, and reliability of the code block 2 and reliability of the code block 4 may If the code sequence $S_c$ 110 101 110 011 101 100 is modulated by using the 16QAM constellation diagram shown in FIG. 1, four bits may be mapped to each constellation point in the 16QAM constellation diagram, where $1^{st}$ and $2^{nd}$ bits in the four bits have high reliability, and $3^{rd}$ and $4^{th}$ bits have low reliability. Bits in a least reliable code block in the code sequence $S_c$ are mapped to non-least reliable bit locations of a constellation point in the 16QAM constellation diagram, where the non-least reliable bit locations herein are specifically locations of $1^{st}$ and $2^{nd}$ bits. Optionally, bits in a most reliable code block in the code sequence $S_c$ are mapped to least reliable bit locations of a constellation point in the 16QAM constellation diagram in the modulation process, where the least reliable bit locations herein are locations of $3^{rd}$ and $4^{th}$ bits. In addition, bits in an intermediately reliable code block in the code sequence $S_c$ may be randomly mapped to locations of $1^{st}$ to $4^{th}$ bits of a constellation point, or mapped as second-most reliable bits to locations of $3^{rd}$ and $4^{th}$ bits, or mapped as bits in a second-least reliable code block to locations of $1^{st}$ and $2^{nd}$ bits.

An example mapping relationship in accordance with one embodiment is shown in Table 6 below:

TABLE 6

| 16QAM constellation modulation | | | | | | | | | |
|---|---|---|---|---|---|---|---|---|---|
| Sequence number of a bit | 1 | 2 | 3 | 4 | 5 | 6 | 7 | 8 | 9 |
| Code sequence $S_c$ | 1 | 1 | 0 | 1 | 0 | 1 | 1 | 1 | 0 |

TABLE 6-continued

16QAM constellation modulation

| Code block | Code block 1 | | | Code block 2 | | | Code block 3 | | |
|---|---|---|---|---|---|---|---|---|---|
| Reliability of a code block in which the bit is located | Intermediate | Intermediate | Intermediate | High | High | High | Low | Low | Low |
| Mapped-to bit of a constellation point | $3^{rd}$ bit | $4^{th}$ bit | $3^{rd}$ bit | $4^{th}$ bit | $3^{rd}$ bit | $4^{th}$ bit | $1^{st}$ bit | $2^{nd}$ bit | $1^{st}$ bit |

| | | | | | | | | | |
|---|---|---|---|---|---|---|---|---|---|
| Sequence number of a bit | 10 | 11 | 12 | 13 | 14 | 15 | 16 | 17 | 18 |
| Code sequence $S_c$ | 0 | 1 | 1 | 1 | 0 | 1 | 1 | 0 | 0 |
| Code block | Code block 4 | | | Code block 5 | | | Code block 6 | | |
| Reliability of a code block in which the bit is located | High | High | High | Low | Low | Low | Intermediate | Intermediate | Intermediate |
| Mapped-to bit of a constellation point | $3^{rd}$ bit | $4^{th}$ bit | $3^{rd}$ bit | $2^{nd}$ bit | $1^{st}$ bit | $2^{nd}$ bit | $1^{st}$ bit | $2^{nd}$ bit | $1^{st}$ bit |

In this embodiment, the code sequence $S_c$ 110 101 110 011 101 100 no longer uses a manner of mapping to constellation points one by one. With reference to FIG. 1 and Table 6, the bits 11 whose sequence numbers are 7 and 8 in the least reliable code block 3 are mapped to locations of $1^{st}$ and $2^{nd}$ non-least reliable bits in the 16QAM constellation diagram (herein, the locations of the $1^{st}$ and $2^{nd}$ bits are most reliable bit locations). Optionally, the bits 11 whose sequence numbers are 1 and 2 in the intermediately reliable code block 1 are mapped to locations of $3^{rd}$ and $4^{th}$ least reliable bits in the 16QAM constellation diagram, a corresponding constellation point is 1111, and a symbol corresponding to the constellation point 1111 is −1−j.

The bit 0 whose sequence number is 9 in the least reliable code block 3 and the bit 1 whose sequence number is 13 in the least reliable code block 5 are mapped to locations of $1^{st}$ and $2^{nd}$ non-least reliable bits in the 16QAM constellation diagram (herein, the locations of the $1^{st}$ and $2^{nd}$ bits are most reliable bit locations). Optionally, the bits 01 whose sequence numbers are 3 and 4 in the intermediately reliable code block 1 and the most reliable code block 2 are mapped to locations of $3^{rd}$ and $4^{th}$ least reliable bits in the 16QAM constellation diagram, a corresponding constellation point is 0101, and a corresponding symbol is 3−j.

The bits 01 whose sequence numbers are 14 and 15 in the least reliable code block 5 are mapped to locations of $1^{st}$ and $2^{nd}$ most reliable bits in the 16QAM constellation diagram. Optionally, the bits 01 whose sequence numbers are 5 and 6 in the most reliable code block 2 are mapped to locations of $3^{rd}$ and $4^{th}$ least reliable bits in the 16QAM constellation diagram, a corresponding constellation point is 0101, and a symbol corresponding to the constellation point 0101 is 3−j.

The bits 01 whose sequence numbers are 16 and 17 in the intermediately reliable code block 6 are mapped to locations of $1^{st}$ and $2^{nd}$ most reliable bits in the 16QAM constellation diagram. Optionally, the bits 01 whose sequence numbers are 10 and 11 in the most reliable code block 4 are mapped to locations of $3^{rd}$ and $4^{th}$ least reliable bits in the 16QAM constellation diagram, a constellation point corresponding to the bits 01 is 1001, and a corresponding symbol is −3+j.

Finally, the bit 1 whose sequence number is 12 in the remaining most reliable code block 4, the bit 0 whose sequence number is 18 in the intermediately reliable code block 6, and two bits in another code word form four bit groups. The four bit groups are mapped to a corresponding constellation point in the 16QAM constellation diagram.

After the foregoing modulation is performed, $S_M$ is output as a symbol sequence −1−j, 3−j, 3−j, −3+j . . . .

All the foregoing mapping processes ensure that the bits in the least reliable code block 3 and the least reliable code block 5 are all mapped to non-least reliable bit locations in the constellation modulation. Therefore, it may be ensured that a least reliable bit is not mapped to a least reliable bit location that is used for constellation modulation, thereby improving modulation performance and increasing a bit error rate.

In a possible implementation, before performing constellation modulation on the bits in the plurality of code blocks in the code sequence $S_c$, the transmit end may further group the code sequence $S_c$. For example, the plurality of code blocks in the code sequence $S_c$ are grouped into at least two groups, where one group includes a most reliable code block, and another group includes a least reliable code block; and bits in the least reliable code block in the another group are mapped to the non-least reliable bit locations that are used for constellation modulation. In this way, the most reliable code block and the least reliable code block are distinguished from each other through grouping, so that mapping processing can be more quickly performed in the constellation modulation process, thereby improving modulation efficiency.

Figure 7:
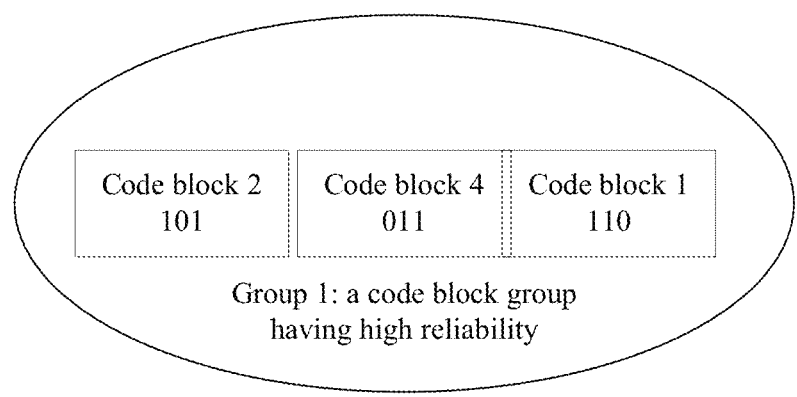
FIG. 7 is a schematic diagram of code block grouping according to an embodiment of this application.
Figure 7:
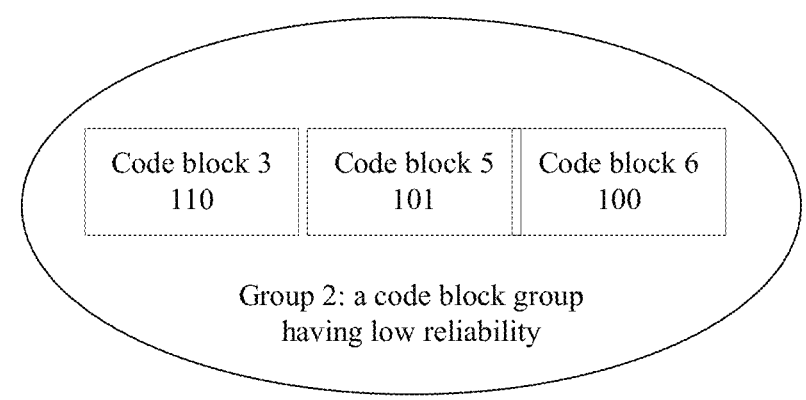

In a specific implementation process, as shown in FIG. 7, the most reliable code block 2 and the most reliable code block 4 in the code sequence $S_c$ may be grouped into one group, the least reliable code block 3 and the least reliable code block 5 may be grouped into another group, and the intermediately reliable code block 1 and the intermediately reliable code block 6 are distributed in the high-reliability group and the low-reliability group.

Figure 8:
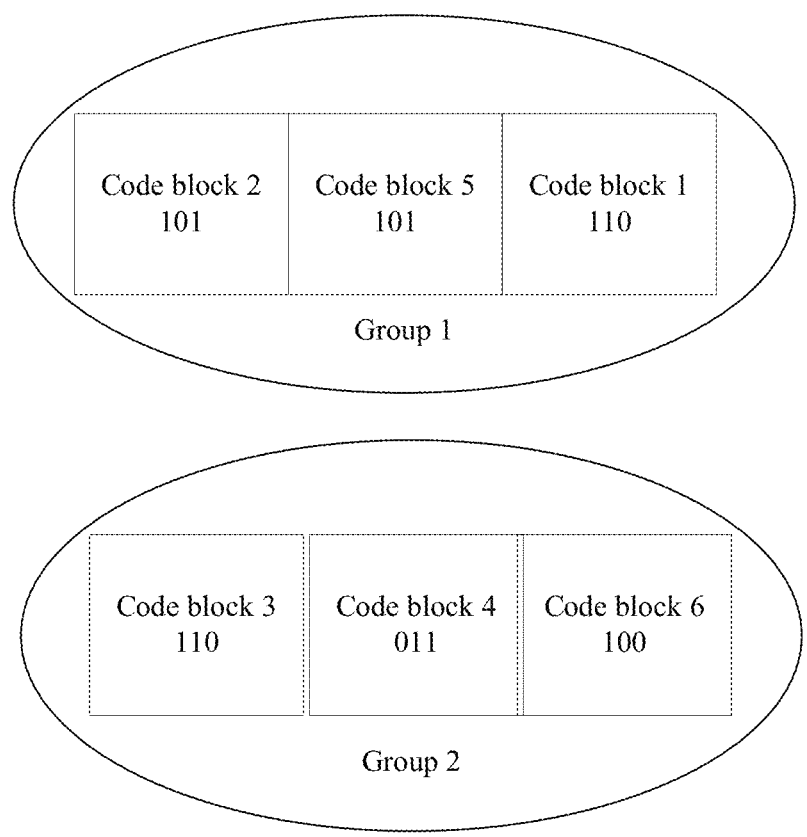
FIG. 8 is another schematic diagram of code block grouping according to an embodiment of this application.

Alternatively, the code sequence $S_c$ is divided into a plurality of groups. Each group includes at least one most reliable code block and one least reliable code block; and corresponding to 16QAM, a quantity of groups is 2, and there are three code blocks in each group. As shown in FIG. 8, a group 1 includes the most reliable code block 2, the least reliable code block 5, and the intermediately reliable code block 1; and a group 2 includes the most reliable code block 4, the least reliable code block 3, and the intermediately reliable code block 6.

If the code sequence $S_c$ 110 101 110 011 101 100 is modulated by using the 64QAM constellation diagram shown in FIG. 2, six bits may be mapped to each constellation point in the 64QAM constellation diagram, where $1^{st}$ and $2^{nd}$ bits in the six bits are the most reliable, $3^{rd}$ and $4^{th}$ bits are intermediately reliable or, in other words, the $3^{rd}$ and $4^{th}$ bits are the second-most reliable or the second least reliable, and $5^{th}$ and $6^{th}$ bits are the least reliable. In a modulation process, bits in a most reliable code block in the code sequence $S_c$ are mapped to $5^{th}$ and $6^{th}$ bits of a constellation point in the 64QAM constellation diagram, bits in a least reliable code block in the code sequence $S_c$ are mapped to $1^{st}$ and $2^{nd}$ bits of a constellation point in the 64QAM constellation diagram, and bits in an intermediately reliable code block in the code sequence $S_c$ are mapped to $3^{rd}$ and $4^{th}$ bits of a constellation point.

A possible mapping relationship is shown in Table 7 below:

In this embodiment of this application, the code sequence $S_c$ 110 101 110 011 101 100 no longer uses a manner of mapping to constellation points one by one. With reference to FIG. 2, the bits 11 whose sequence numbers are 1 and 2 in the intermediately reliable code block 1 are mapped to locations of $3^{rd}$ and $4^{th}$ intermediately reliable bits in the 64QAM constellation diagram, the bits 10 whose sequence numbers are 4 and 5 in the most reliable code block 2 are mapped to locations of $5^{th}$ and $6^{th}$ least reliable bits in the 64QAM constellation diagram, the bits 11 whose sequence numbers are 7 and 8 in the least reliable code block 3 are mapped to locations of $1^{st}$ and $2^{nd}$ most reliable bits in the 64QAM constellation diagram, a corresponding constellation point is 111110, and a symbol corresponding to the constellation point 111110 is −3−1j. Mapping of the other bits is similar, and is not enumerated herein.

Figure 9:
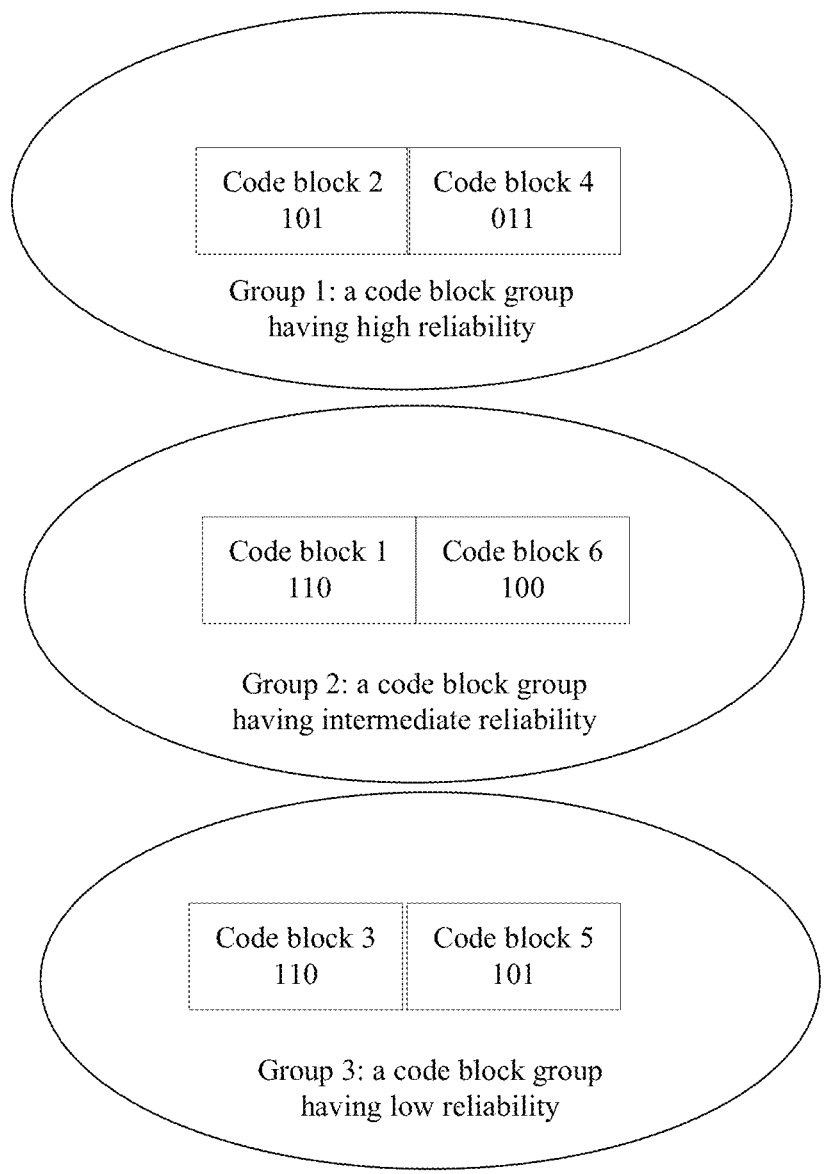
FIG. 9 is still another schematic diagram of code block grouping according to an embodiment of this application.

Similarly, to increase modulation efficiency, in a specific implementation process, as shown in FIG. 9, the most reliable code blocks (the code block 2 and the code block 4) in the code sequence $S_c$ may be grouped into one group, the least reliable code blocks (the code block 3 and the code block 5) may be grouped into another group, and the intermediately reliable code blocks (the code block 1 and the code block 6) may be grouped into an intermediately reliable group.

Alternatively, the code sequence $S_c$ is divided into a plurality of groups, and each group at least includes one most reliable code block, one least reliable code block, and one intermediately reliable code block.

Figure 10:
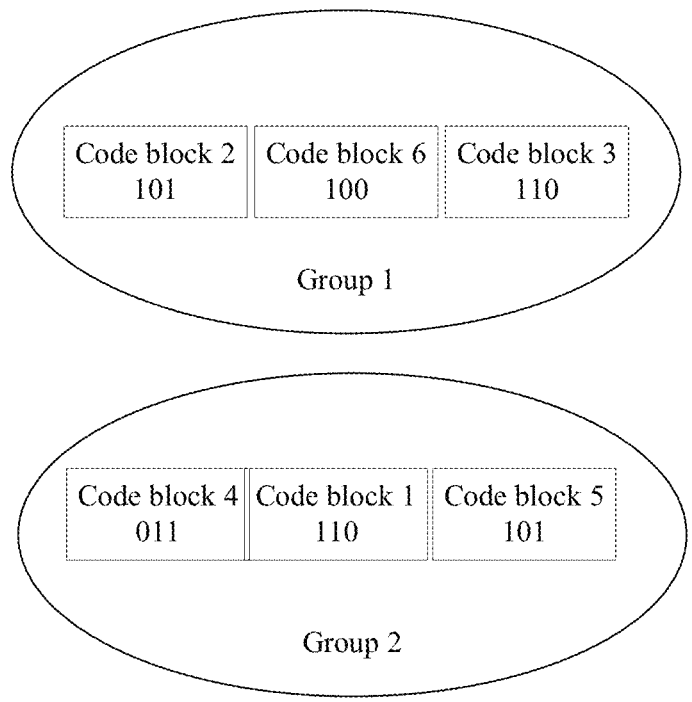
FIG. 10 is yet another schematic diagram of code block grouping according to an embodiment of this application.

For example, as shown in FIG. 10, a group 1 includes the most reliable code block 2, the least reliable code block 3, and the intermediately reliable code block 6; and a group 2 includes the most reliable code block 4, the least reliable code block 5, and the intermediately reliable code block 1.

Second scenario: a process in which a column weight of each column in the LDPC matrix H is calculated, a code degree of a code block that is in the code sequence $S_c$ and that corresponds to each column is determined, and constellation modulation is performed based on code degrees of code blocks in the code sequence $S_c$.

With reference to Table 8, in this embodiment, a process of calculating a column weight of each column in the LDPC check matrix H and determining the code degree of the code block that is in the code sequence $S_c$ and that corresponds to

TABLE 7

| | 64QAM constellation modulation | | | | | | | | | |
|---|---|---|---|---|---|---|---|---|---|---|
| Sequence number of a bit | 1 | 2 | 3 | 4 | 5 | 6 | 7 | 8 | 9 | 10 |
| Code sequence $S_c$ | 1 | 1 | 0 | 1 | 0 | 1 | 1 | 1 | 0 | 0 |
| Code block | Code block 1 | | | Code block 2 | | | Code block 3 | | | Code block 4 |
| Reliability of a code block in which the bit is located | Intermediate | Intermediate | Intermediate | High | High | High | Low | Low | Low | High |
| Mapped-to bit of a constellation point | $3^{rd}$ bit | $4^{th}$ bit | $3^{rd}$ bit | $5^{th}$ bit | $6^{th}$ bit | $5^{th}$ bit | $1^{st}$ bit | $2^{nd}$ bit | $1^{st}$ bit | $6^{th}$ bit |
| Sequence number of a bit | 11 | 12 | 13 | 14 | 15 | 16 | 17 | 18 | | |
| Code sequence $S_c$ | 1 | 1 | 1 | 0 | 1 | 1 | 0 | 0 | | |
| Code block | Code block 4 | | Code block 5 | | | Code block 6 | | | | |
| Reliability of a code block in which the bit is located | High | High | Low | Low | Low | Intermediate | Intermediate | Intermediate | | |
| Mapped-to bit of a constellation point | $5^{th}$ bit | $6^{th}$ bit | $2^{nd}$ bit | $1^{st}$ bit | $2^{nd}$ bit | $3^{rd}$ bit | $4^{th}$ bit | $3^{rd}$ bit | | | each column. In addition, a column weight of a particular column in the LDPC matrix H is equal to a column weight of a corresponding original column in the base matrix $H_b$. Therefore, a code degree of a code block corresponding to the particular column in the LDPC matrix H is equal to a code degree of a code block corresponding to the corresponding original column in the base matrix $H_b$, and a mapping relationship between each bit in the code block and a high-reliability/low-reliability bit in 16QAM and 64QAM is also the same. For details, refer to Table 6 and Table 7. Therefore, the modulated symbol sequence is also the same. A process thereof is not described herein again.

be implemented by using a principle of mapping the bits in the LDPC-encoded least reliable code block to most reliable or second-most reliable bit locations that are used for constellation modulation, thereby improving a technical effect of encoding performance.

It is well known that because a channel environment is complex and variable, during channel encoding, a code word needs to be retransmitted by using a hybrid automatic repeat request (HARQ) technology, to improve performance of a communications system. The HARQ technology includes two solutions: chase combining (CC) and incremental redundancy (IR).

TABLE 8

Correspondence between code degrees and column weights of the check matrix

| Sequence number of a bit | 1 | 2 | 3 | 4 | 5 | 6 | 7 | 8 | 9 |
|---|---|---|---|---|---|---|---|---|---|
| Code sequence $S_c$ | 1 | 1 | 0 | 1 | 0 | 1 | 1 | 1 | 0 |
| Code block | | Code block 1 | | | Code block 2 | | | Code block 3 | |
| Code degree | | 2 | | | 3 | | | 1 | |
| Column corresponding to the check matrix | Column 1 | Column 2 | Column 3 | Column 4 | Column 5 | Column 6 | Column 7 | Column 8 | Column 9 |
| Column weight of the check matrix | 2 | 2 | 2 | 3 | 3 | 3 | 1 | 1 | 1 |

| Sequence number of a bit | 10 | 11 | 12 | 13 | 14 | 15 | 16 | 17 | 18 |
|---|---|---|---|---|---|---|---|---|---|
| Code sequence $S_c$ | 0 | 1 | 1 | 1 | 0 | 1 | 1 | 0 | 0 |
| Code block | | Code block 4 | | | Code block 5 | | | Code block 6 | |
| Code degree | | 3 | | | 1 | | | 2 | |
| Column corresponding to the check matrix | Column 10 | Column 11 | Column 12 | Column 13 | Column 14 | Column 15 | Column 16 | Column 17 | Column 18 |
| Column weight of the check matrix | 3 | 3 | 3 | 1 | 1 | 1 | 2 | 2 | 2 |

Certainly, a code degree of a code block herein may be further z times a corresponding column weight of a single column of the LDPC matrix H, or may be a sum of column weights of z columns. However, a correspondence of reliability of a code block is the same. Details are not described herein again.

If the code sequence $S_c$ 110 101 110 011 101 100 is modulated by using the 16QAM constellation diagram shown in FIG. 1 or the 64QAM constellation diagram shown in FIG. 2, a mapping relationship of the code sequence $S_c$ is the same as the mapping relationship shown in Table 6 or Table 7. Because a column weight of the base matrix $H_b$ corresponds to a column weight of the LDPC matrix H, weight values of bits that can be determined in the base matrix $H_b$ and the LDPC matrix H are also consistent, and subsequent mapping and modulation results are also the same. Details are not described herein again.

When mapping to constellation points is performed, regardless of whether the 16QAM constellation diagram or the 64QAM constellation diagram is used, it is only required that bits in an LDPC-encoded least reliable code block are mapped to non-least reliable bit locations that are used for constellation modulation. Optionally, uniform reliability can After decoding an LDPC code that is initially transmitted by the transmit end at an initial transmission rate, the receive end may determine whether the initially transmitted LDPC code is successfully decoded; and if determining that the initially transmitted LDPC code is successfully decoded, send an acknowledgment (ACK) instruction to the transmit end, to complete current data transmission; or if determining that the initially transmitted LDPC code fails to be decoded, send a negative acknowledgment (NACK) instruction to the transmit end, so that the transmit end performs retransmission, until decoding performed by the receive end succeeds or a quantity of retransmission times reaches a preset threshold.

In another implementation, after the receive end decodes an initially transmitted LDPC code by using a first transformation matrix, the receive end determines whether the initially transmitted LDPC code is successfully decoded; and if determining that the initially transmitted LDPC code is successfully decoded, sends an ACK instruction to the transmit end, to complete current data transmission; or if determining that the initially transmitted LDPC code failed to be decoded, sends a NACK instruction to the transmit end, so that the transmit end constructs to-be-retransmitted bits based on the NACK instruction and sends the to-be-retransmitted bits at a retransmission rate.

Figure 11:
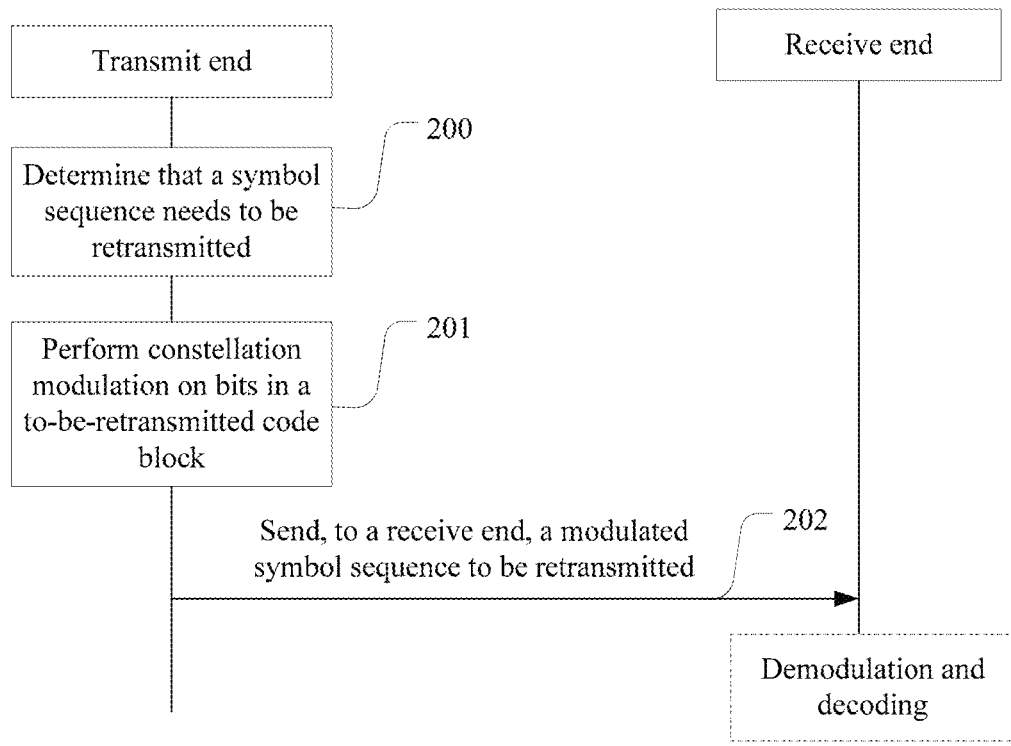
FIG. 11 is a schematic flowchart of Embodiment 2 of an encoding and modulation method according to an embodiment of this application.

With reference to the foregoing possible implementations, when the technical solutions of this application are applied to hybrid automatic repeat request (HARQ) retransmission, as shown in FIG. 11, an encoding and modulation method provided in an embodiment of this application is as follows:

Step 200: Determine that a symbol sequence $S_M$ needs to be retransmitted.

It should be noted that a manner in which a transmit end determines the symbol sequence $S_M$ needs to be retransmitted includes, but is not limited to, the following two manners: In one manner, it is considered that retransmission is needed if a NACK instruction sent by a receive end is received; or in the other manner, it is considered that retransmission is needed if an ACK instruction returned by the receive end is not received within a predetermined time.

Step 201: Modulate, through constellation modulation, bits needing to be retransmitted in a code sequence $S_c$, to obtain a modulated symbol sequence $S_R$ to be retransmitted.

Step 202: Send the to-be-retransmitted symbol sequence $S_R$ to a receive end.

After receiving the to-be-retransmitted symbol sequence $S_R$, the receive end demodulates and decodes the to-be-retransmitted symbol sequence $S_R$.

There are at least the following three manners for implementing step 201:

In a first manner, bits in a code block needing to be retransmitted in the code sequence $S_c$ are modulated in a mapping manner the same as a mapping manner used during initial retransmission, to obtain the modulated symbol sequence $S_R$ to be retransmitted, and bits in a least reliable code block needing to be retransmitted in the code sequence $S_c$ are mapped to the non-least reliable bit locations that are used for constellation modulation. Optionally, bits in a least reliable code block in the code sequence $S_c$ are mapped, in a modulation process, to most reliable or second-most reliable bit locations that are used for constellation modulation, and bits in a most reliable code block needing to be retransmitted in the code sequence S are mapped to least reliable bit locations that are used for constellation modulation, to obtain the modulated symbol sequence $S_R$ to be retransmitted.

In a second manner, bits in a code block needing to be retransmitted in the code sequence S are modulated in a mapping manner different from a mapping manner used during initial retransmission, to obtain the modulated symbol sequence $S_R$ to be retransmitted. In other words, bits in a code block needing to be retransmitted are sequentially mapped to bit locations of a constellation point for constellation modulation.

In a third manner, bits in an LDPC-encoded code block needing to be retransmitted are inverted before the bits are mapped in either of the foregoing two manners. For example, bits in a code block 2 and a code block 3 need to be retransmitted, $1^{st}$ and $2^{nd}$ bits 10 in the most reliable code block 2 are inverted to obtain 01, $1^{st}$ and $2^{nd}$ bits 10 in a least reliable code block 5 are inverted to obtain 01, and then mapping is performed after 01 and 01 are combined. A mapping process may be in one of the foregoing two manners.

It should be noted that if the terminal receives again the NACK instruction sent by the receive end or still does not receive the ACK instruction within the predetermined time, the terminal regenerates the to-be-retransmitted symbol sequence $S_R$ and sends the to-be-retransmitted symbol sequence $S_R$ to the receive end, until an acknowledgment ACK instruction sent by the receive end is received or a quantity of retransmission times reaches a preset threshold.

According to the technical solutions provided in this application and with reference to a HARQ transmission process, bits having different reliability are transmitted a plurality of times, to obtain a combination gain, so that a bit error rate is further reduced, thereby improving transmission reliability.

The foregoing mainly describes the solutions provided in various embodiments from a perspective of an overall environment and hardware apparatuses of a communications system, and from a perspective of a method process. It may be understood that to implement the foregoing functions, network elements such as the terminal, the base station, and the control node include corresponding hardware structures and/or software modules for executing the functions. A person skilled in the art shall be aware that in combination with the examples described in the embodiments disclosed in this specification, algorithm steps may be implemented in a form of hardware or in a form of hardware combining computer software in this application. Whether a function is executed by hardware or computer software driving hardware depends on particular applications and design constraint conditions of the technical solutions. A person skilled in the art may use different methods to implement the described functions for each particular application, but it should not be considered that the implementation goes beyond the scope of this application.

Function modules of the communications apparatus may be divided according to the method examples in the embodiments of this application. For example, function modules may be divided based on the functions, or two or more functions may be integrated into one processing module. The foregoing integrated module may be implemented in a form of hardware, or may be implemented in a form of a software function module. It should be noted that the module division in this embodiment of this application is an example and is merely logical function division, and there may be other division manners in an actual implementation.

The communications apparatus provided in various embodiments may be a cellular terminal, a D2D terminal, a base station, a control node, or the like. For specific implementations of functions of the communications apparatus, refer to the encoding and modulation method provided in the embodiments of this application.

Figure 12:
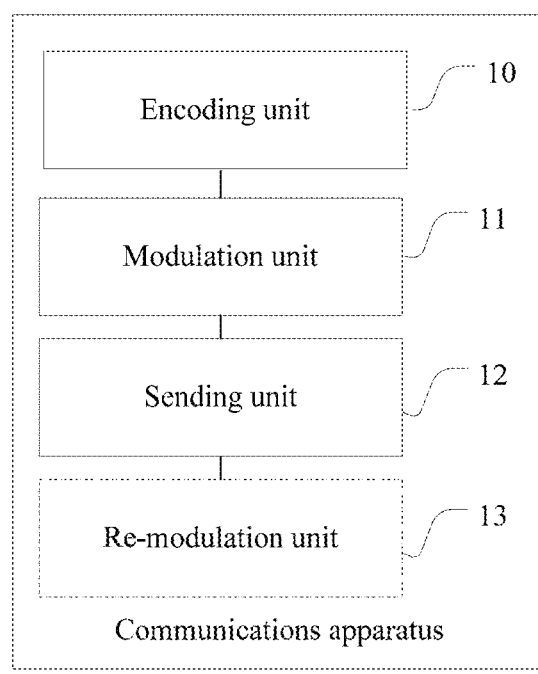
FIG. 12 is another schematic structural diagram of a communications apparatus according to an embodiment of this application.

When the function modules are divided based on the functions, FIG. 12 is a schematic structural diagram of Embodiment 1 of a communications apparatus according to an embodiment of this application.

The communications apparatus in this embodiment includes:

an encoding unit 10, configured to: obtain an information bit sequence $S_b$, and encode the information bit sequence $S_b$ by using a low-density parity-check LDPC matrix H, to obtain an encoded code sequence $S_c$; and a modulation unit 11, configured to modulate the code sequence $S_c$ that is obtained by the encoding unit 10 through encoding, to obtain a modulated symbol sequence $S_M$, where bits in a least reliable code block in the code sequence $S_c$ are mapped, in a modulation process, to non-least reliable bit locations that are used for constellation modulation, so that a problem of a poor modulation effect and a very high bit error rate that are caused by mapping the bits in the least reliable code block to least reliable bit locations that are used for constellation modulation is avoided, and reliability of the modulated symbol sequence is relatively high;

and a sending unit 12, configured to send the symbol sequence $S_M$ that is obtained by the modulation unit 11 through modulation to the receive end.

It should be noted that for function descriptions of the corresponding function modules, refer to all the related content of the steps in the foregoing method embodiments. Details are not described herein again.

The communications apparatus is configured to perform the process of the encoding and modulation method described previously. Therefore, the communications apparatus can also achieve technical effects the same as the technical effects of the encoding and modulation method. Details are not described herein again.

In a possible implementation, in addition to the encoding unit 10, the modulation unit 11, and the sending unit 12, the communications apparatus further includes: a re-modulation unit 13, configured to modulate, when the symbol sequence $S_M$ needs to be retransmitted, bits in a code block needing to be retransmitted, to obtain a modulated symbol sequence $S_R$ to be retransmitted.

There are at least two implementations of the re-modulation unit 13.

In one design, when the symbol sequence $S_M$ needs to be retransmitted, the re-modulation unit 13 modulates, in a mapping manner the same as a mapping manner used during initial transmission, bits in a code block needing to be retransmitted in the code sequence $S_c$, to obtain a modulated symbol sequence $S_R$ to be retransmitted.

In another design, when the symbol sequence $S_M$ needs to be retransmitted, the re-modulation unit 13 sequentially inputs bits in a code block needing to be retransmitted in the code sequence $S_c$ into bit locations that are used for constellation modulation, to perform modulation to obtain a modulated symbol sequence $S_R$ to be retransmitted.

Optionally, before bits in a code block needing to be retransmitted in the code sequence $S_c$ are modulated, the re-modulation unit 13 may further perform inversion processing on the bits in the code block needing to be retransmitted.

If the communications apparatus receives again a NACK instruction sent by the receive end or does not receive an ACK instruction within a predetermined time, the re-modulation unit 13 regenerates the to-be-retransmitted symbol sequence $S_R$ and sends the to-be-retransmitted symbol sequence $S_R$ to the receive end, until an acknowledgment ACK instruction sent by the receive end is received or a quantity of retransmission times reaches a preset threshold.

In some implementations, the re-modulation unit 13 and the modulation unit 11 may alternatively be a same function module.

It should be noted that for function descriptions of the corresponding function modules, refer to all the related content of the steps in the method embodiments. Details are not described herein again.

According to the communications apparatus provided in this application and with reference to a HARQ transmission process, bits having different reliability are transmitted a plurality of times, to obtain a combination gain, so that a bit error rate is further reduced, thereby improving transmission reliability.

According to the communications apparatus provided in this application, bits having different reliability during LDPC encoding may be modulated together with bits having different reliability during modulation, where an LDPC-encoded high-reliability bit is mapped to a low-reliability bit location, and a low-reliability bit is mapped to a high-reliability bit location, so that reliability of all bits of modulated LDPC codes is relatively high and uniform, thereby improving encoding performance and implementing more reliable transmission.

It should be noted that the processor 40 may be a central processing unit (CPU), a network processor (NP), or a combination of a CPU and an NP. The processor may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), generic array logic (GAL), or any combination thereof.

The memory 43 may include a volatile memory, for example, a random access memory (RAM). Alternatively, the memory may include a non-volatile memory, for example, a flash memory, a hard disk drive (hHDD), or a solid-state drive (SSD). Alternatively, the memory may include a combination of the foregoing types of memories.

The communications interface is configured to communicate with another device. The communications interface may be a wired communications interface, a wireless communications interface, or a combination thereof. For example, the wired communications interface may be an Ethernet interface. The Ethernet interface may be an optical interface, an electrical interface, or a combination thereof. The wireless communications interface may be a wireless local area network (WLAN) interface, a cellular network communications interface, or a combination thereof.

The terminal in various embodiments may include various handheld devices, in-vehicle devices, wearable devices, or computing devices that have a wireless communication function, or another processing device connected to a wireless modem. Alternatively, the terminal may be referred to as a mobile station (mobile station, MS for short) or a terminal, or may include a subscriber unit, a cellular phone, a smartphone, a wireless data card, a personal digital assistant (PDA) computer, a tablet computer, a wireless modem, a handheld device, a laptop computer, a cordless phone, a wireless local loop (WLL) station, a machine type communication (MTC) terminal, or the like. For ease of description, the aforementioned devices are collectively referred to as terminals in all the embodiments of this application.

The foregoing descriptions about implementations allow a person skilled in the art to clearly understand that for the purpose of convenient and brief description, division of the foregoing function modules is merely used as an example for illustration. In an actual application, the foregoing functions may be allocated to different function modules for implementation as required, that is, an inner structure of an apparatus is divided into different function modules to implement all or some of the aforementioned functions.

In the several embodiments provided in this application, it should be understood that the disclosed apparatus and method may be implemented in other manners. For example, the described apparatus embodiment is merely an example. For example, the module or unit division is merely logical function division and there may be other division manners in an actual implementation. For example, a plurality of units or components may be combined or integrated into another apparatus, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may be one or more physical units, that is, may be located in one place, or may be distributed in different places. Some or all of the units may be selected according to actual requirements to achieve the objectives of the solutions of the embodiments.

In addition, functional units in the embodiments of this application may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a readable storage medium. Based on such an understanding, the technical solutions of this application essentially, or the part contributing to the prior art, or all or a part of the technical solutions may be implemented in a form of a software product. The software product is stored in a storage medium and includes several instructions for instructing a device (which may be a single-chip microcomputer, a chip or the like) or a processor to perform all or some of the steps of the methods described in the embodiments of this application. The foregoing storage medium includes: any medium that can store program code, such as a USB flash drive, a removable hard disk, a ROM, a RAM, a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An encoding and modulation method implemented by a transmission device, comprising:
    obtaining, by the transmission device, an information bit sequence, encoding, by the transmission device, the information bit sequence using a low-density parity-check (LDPC) matrix, to obtain an encoded code sequence, wherein the LDPC matrix is generated by expanding a base matrix by using an expansion factor, and a value of the expansion factor is a positive integer;
    modulating, by the transmission device, the encoded code sequence, to obtain a modulated symbol sequence, wherein the modulating comprises mapping the bits in a least reliable code block in the encoded code sequence to non-least reliable bit locations for constellation modulation; and
    sending, by the transmission device, the modulated symbol sequence to a receive end.

2. The encoding and modulation method according to claim 1, wherein the modulating comprises mapping the bits in the least reliable code block in the code sequence to non-least reliable bit locations used for constellation modulation comprises:
    the bits in the least reliable code block in the code sequence are mapped, in the modulation process, to most reliable or second-most reliable bit locations that are used for constellation modulation.

3. The method according to claim 2, wherein the method further comprises: mapping bits in a most reliable code block in the code sequence to least reliable bit locations that are used for constellation modulation.

4. The method according to claim 1, wherein the code sequence comprises a plurality of code blocks, each code block corresponding to a code degree, and a code block having a smallest code degree value is the least reliable code block.

5. The method according to claim 4, wherein the code degree of each code block is obtained through calculation based on a column weight of each column of the base matrix; or
    the code degree of each code block is obtained through calculation based on a column weight of each column of the check matrix.

6. The method according to claim 4, wherein modulating the code sequence, to obtain a modulated symbol sequence, wherein bits in the least reliable code block in the code sequence are mapped, in the modulation process, to the non-least reliable bit locations that are used for constellation modulation comprises:
    grouping the plurality of code blocks in the code sequence into at least two groups, wherein one group comprises a most reliable code block, and another group comprises a least reliable code block; and
    mapping bits in the least reliable code block in the another group to the non-least reliable bit locations that are used for constellation modulation.

7. The method according to claim 6, wherein the method further comprises: mapping bits in the most reliable code block in the one group to least reliable bit locations that are used for constellation modulation.

8. A communications apparatus, comprising:
    a processor, configured to:
    obtain an information bit sequence, and encode the information bit sequence using a low-density parity-check (LDPC) matrix, to obtain an encoded code sequence, wherein the LDPC matrix is generated by expanding a base matrix using an expansion factor, and a value of the expansion factor is a positive integer; and
    modulate the encoded code sequence, to obtain a modulated symbol sequence, wherein the processor is configured to map the bits in a least reliable code block in the encoded code sequence to non-least reliable bit locations that are used for constellation modulation; and
    a transmitter, configured to send the symbol sequence that is obtained by the processor through modulation to a receive end.

9. The communications apparatus according to claim 8, wherein the bits in the least reliable code block in the code sequence are mapped, in the modulation process, to most reliable or second-most reliable bit locations that are used for constellation modulation.

10. The communications apparatus according to claim 8, wherein bits in a most reliable code block in the code sequence are mapped to least reliable bit locations that are used for constellation modulation.

11. The communications apparatus according to claim 8, wherein the code sequence comprises a plurality of code blocks, each code block corresponding to a code degree, and a code block having a smallest code degree value being the least reliable code block.

12. The communications apparatus according to claim 11, wherein the code degree of each code block is obtained through calculation based on a column weight of each column of the base matrix; or
    the code degree of each code block is obtained through calculation based on a column weight of each column of the check matrix.

13. The communications apparatus according to claim 12, wherein the processor is configured to:
- group the plurality of code blocks in the code sequence into at least two groups, wherein one group comprises a most reliable code block, and another group comprises a least reliable code block; and
- map bits in the least reliable code block in the another group to the non-least reliable bit locations that are used for constellation modulation.

14. The communications apparatus according to claim 13, wherein the processor is configured to map bits in the most reliable code block in the one group to least reliable bit locations that are used for constellation modulation.

15. The communications apparatus according to claim 14, wherein the communications apparatus further comprises a memory and a system bus; and, wherein
- the memory is configured to store a computer-executable instruction, and is connected to the processor by using the system bus, and the processor runs the computer-executable instruction stored in the memory.

16. The communications apparatus according to claim 8, wherein the communications apparatus is a cellular terminal, a device-to-device (D2D) terminal, a base station, or a control node.

* * * * *